(12) United States Patent
Novet et al.

(10) Patent No.: US 10,745,822 B2
(45) Date of Patent: Aug. 18, 2020

(54) METHOD FOR PRODUCING METAL OXIDE NANOCRYSTALS, METHOD FOR PRODUCING MULTI-ELEMENT OXIDE NANOCRYSTALS, AND METAL OXIDE NANOCRYSTALS

(71) Applicant: Shoei Chemical Inc., Shinjuku-ku, Tokyo (JP)

(72) Inventors: Thomas E. Novet, Corvallis, OR (US); Yukihisa Okawa, Eugene, OR (US); Masahito Igari, Eugene, OR (US); David M. Schut, Philomath, OR (US)

(73) Assignee: SHOEI CHEMICAL INC., Shinjuku-Ku, Tokyo (JP)

(*) Notice: Subject to any disclaimer, the term of this patent is extended or adjusted under 35 U.S.C. 154(b) by 95 days.

(21) Appl. No.: 15/747,095

(22) PCT Filed: Jul. 22, 2016

(86) PCT No.: PCT/JP2016/071608
§ 371 (c)(1),
(2) Date: Jan. 23, 2018

(87) PCT Pub. No.: WO2017/014313
PCT Pub. Date: Jan. 26, 2017

(65) Prior Publication Data
US 2018/0371638 A1 Dec. 27, 2018

Related U.S. Application Data

(60) Provisional application No. 62/196,254, filed on Jul. 23, 2015, provisional application No. 62/196,257, filed on Jul. 23, 2015.

(51) Int. Cl.
*C30B 7/00* (2006.01)
*C30B 7/08* (2006.01)
(Continued)

(52) U.S. Cl.
CPC ........... *C30B 7/08* (2013.01); *C01B 13/18* (2013.01); *C01B 13/185* (2013.01); *C01F 7/02* (2013.01);
(Continued)

(58) Field of Classification Search
CPC ............... C30B 7/00; C30B 7/02; C30B 7/14
See application file for complete search history.

(56) References Cited

U.S. PATENT DOCUMENTS 6,179,912 B1 * 1/2001 Barbera-Guillem ... B82Y 30/00
117/68
7,531,149 B2 5/2009 Peng et al.
(Continued)

FOREIGN PATENT DOCUMENTS

JP 2009172593 A 8/2009
JP 2011502946 A 1/2011
(Continued)

OTHER PUBLICATIONS

Shoei Chemical Inc., Informal Comments on the Written Opinion of the International Searching Authority Issued in PCT Application No. PCT/JP2016/071608, dated Dec. 26, 2017, 14 pages.
(Continued)

*Primary Examiner* — Robert M Kunemund
(74) *Attorney, Agent, or Firm* — Alleman Hall Creasman & Tuttle LLP

(57) ABSTRACT

A method for producing metal oxide nanocrystals, according to the embodiment of the present invention, includes: continuously flowing, into a continuous flow path, one or a plurality of nanocrystal precursor solutions each comprising one or more nanocrystal precursors dissolved in a non-polar solvent; directing a segmenting gas into the continuous flow path to create a segmented reaction flow; flowing the segmented reaction flow into a thermal processor; heating the
(Continued)

segmented reaction flow in the thermal processor to create a product flow; and collecting metal oxide nanocrystals from the product flow.

2 Claims, 10 Drawing Sheets

(51) Int. Cl.
    *C01G 1/02* (2006.01)
    *C01G 19/00* (2006.01)
    *C01B 13/18* (2006.01)
    *C01F 17/206* (2020.01)
    *C01F 7/02* (2006.01)
    *C30B 35/00* (2006.01)
    *B82Y 30/00* (2011.01)
    *B82Y 40/00* (2011.01)
    *C01G 15/00* (2006.01)
    *C01G 41/02* (2006.01)

(52) U.S. Cl.
    CPC .............. *C01F 17/206* (2020.01); *C01G 1/02* (2013.01); *C01G 19/00* (2013.01); *C30B 35/005* (2013.01); *B82Y 30/00* (2013.01); *B82Y 40/00* (2013.01); *C01G 15/00* (2013.01); *C01G 41/02* (2013.01); *C01P 2004/64* (2013.01)

(56) References Cited

U.S. PATENT DOCUMENTS

| 8,133,441 | B2 | 3/2012 | He et al. |
| 8,211,388 | B2 | 7/2012 | Woodfield et al. |
| 2005/0129580 | A1* | 6/2005 | Swinehart ............. B01F 5/0475 422/400 |
| 2008/0112856 | A1* | 5/2008 | Stott ........................ C30B 7/14 422/105 |
| 2009/0258076 | A1 | 10/2009 | Cheon et al. |
| 2009/0269269 | A1 | 10/2009 | White et al. |
| 2010/0251856 | A1 | 10/2010 | Santhanam et al. |
| 2010/0269634 | A1 | 10/2010 | Vanheusden et al. |
| 2011/0229978 | A1* | 9/2011 | Angros ................... B01L 7/00 436/174 |
| 2013/0089739 | A1 | 4/2013 | Polshettiwar et al. |
| 2015/0059236 | A1 | 3/2015 | Difrancesco et al. |
| 2015/0182936 | A1* | 7/2015 | Kim ....................... B01J 19/126 423/509 |

FOREIGN PATENT DOCUMENTS

| JP | 2011508721 A | 3/2011 |
| JP | 2012051762 A | 3/2012 |
| JP | 2013111562 A | 6/2013 |
| JP | 2014034495 A | 2/2014 |
| JP | 2015017000 A | 1/2015 |
| WO | 9802237 A1 | 1/1998 |
| WO | 2005095681 A1 | 10/2005 |
| WO | 2009092684 A2 | 7/2009 |
| WO | 2014153266 A2 | 9/2014 |

OTHER PUBLICATIONS

International Bureau of WIPO, International Preliminary Report on Patentability Issued in PCT Application No. PCT/JP2016/071608, dated Feb. 1, 2018, 13 pages.
Rangappa, D. et al., "Synthesis, characterization and organic modification of copper manganese oxide nanocrystals under supercritical water," The Journal of Supercritical Fluids, vol. 44, Issue 3, Apr. 2008, 6 pages.
Choi, C. et al. "Aqueous Synthesis of Tailored ZnO Nanocrystals, Nanocrystal Assemblies, and Nanostructured Films by Physical Means Enabled by a Continuous Flow Microreactor," Crystal Growth & Design, Jul. 29, 2014, 34 pages.
Testino, A. et al. "Continous Polyol Synthesis of Metal and Metal Oxide Nanoparticles Using a Segmented Flow Tubular Reactor (SFTR)," Molecules, vol. 20, Issue 6, Jun. 8, 2015, 16 pages.
The International Bureau of WIPO, International Preliminary Report on Patentability Issued in PCT Application No. PCT/JP2018/071609, dated Feb. 1, 2018, 13 pages.
Aimable, A, et al., "Precipitation of Nanosized and Nanostructured Powders: Process Intensification and Scale-Out Using a Segmented Flow Tubular Reactor (SFTR)," Chemical Engineering Transactions Journal, Oct. 19, 2010, 10 pages.
Testino, A, et al., "Continuous Polyol Synthesis of Metal and Metal Oxide Nanoparticles Using a Segmented Flow Tubular Reactor (SFTR)," Molecules Journal, Jun. 8, 2015, 16 pages.
European Patent Office, Extended European Search Report Issued in Application No. 16827873.7, dated Apr. 30, 2019, Germany, 10 pages.

* cited by examiner

METHOD FOR PRODUCING METAL OXIDE NANOCRYSTALS, METHOD FOR PRODUCING MULTI-ELEMENT OXIDE NANOCRYSTALS, AND METAL OXIDE NANOCRYSTALS

TECHNICAL FIELD

The present invention relates to a method for producing metal oxide nanocrystals, a method for producing multi-element oxide nanocrystals, and metal oxide nanocrystals.

BACKGROUND ART

Nanoparticles, which may include nanocrystals, nanocrystallites, nanocrystalline materials, quantum dots, and quantum dot materials, among other classifications, are produced and used for wide ranging applications. Production of homogenous nanoparticles of similar size ensures a consistency necessary for reliable and predicable use in downstream applications. Coordinating ligands bound to the surface of the nanoparticles may provide a wide variety of properties to the nanoparticles.

The properties of the nanoparticles are highly dependent on the size and composition of the particles. For example, nanocrystals are crystalline particles with at least one dimension measuring less than 100 nanometers (nm), and may comprise single-crystals or polycrystalline materials, as opposed to amorphous, non-crystalline solids. Based on their size, structure, and composition, the nanocrystals may have unique optical properties.

Some classes of nanocrystals have electrochromic properties. The electrochromic nanocrystals are able to reversibly change their optical properties responsive to a change in particle charge (oxidation or reduction). By applying an electrochemical potential to the nanocrystals, the absorption and transmission properties of the nanocrystals change. Depending on the spectral qualities of the nanocrystal, this process may result in a visible color change.

Smart windows provide an application for electrochromic nanocrystals that may both save energy and enhance privacy. Windows may be coated with nanocrystalline materials that are transparent at a default bias and charge state. However, when the nanocrystals are electrically charged and achieve a certain bias, light may be blocked. Some electrochromic nanocrystals are spectrally specific for certain wavelengths (e.g., UV, Visible, Near-IR). However, some electrochromic nanocrystals may be capable of blocking visible light at one bias, but at a different bias are transparent to visible light, but block near-IR light. By selectively layering nanocrystals onto a glass substrate (optionally including optically transparent conductive oxide nanocrystals), the transmission of a smart window may be optimized based on time of day and/or time of year, and may further be optimized for energy efficiency and/or privacy.

As a method for producing nanocrystals, methods described in U.S. Pat. Nos. 7,531,149; 8,133,441; 8,211,388; U.S. Patent Application Publication No. 2010/0269634; U.S. Patent Application Publication No. 2010/0251856; U.S. Patent Application Publication No. 2009/0258076; U.S. Patent Application Publication No. 2009/0269269; International Patent Publication No. WO2009/092684; U.S. Patent Application Publication No. 2013/0089739; U.S. Patent Application Publication No. 2015/0059236; Testino, A. et al., "Continuous Polyol Synthesis of Metal and Metal Oxide Nanoparticles Using a Segmented Flow Tubular Reactor (SFTR)." Molecules 2015, 20, pp. 10566-10581; Ragappa, D. et al., "Synthesis, characterization and organic modification of copper manganese oxide nanocrystals under supercritical water." Journal of Supercritical Fluids 2008, 44, pp. 441-445; and Choi, C. H. et al., "Aqueous Synthesis of Tailored ZnO Nanocrystals, Nanocrystal Assemblies, and Nanostructured Films by Physical Means Enabled by a Continuous Flow Microreactor." Crystal Growth & Design 2014, 14(9), pp. 4759-4767 are known, for example.

SUMMARY OF THE INVENTION

Technical Problem

Ideal nanocrystals for smart windows have rapid bias switching times, high coloration efficiency and high stability over electrochemical structuring. It is desirable for the nanocrystals to be of high, consistent quality to help ensure desirable performance. As the bias, and thus the functionality, of the electrochromic nanocrystals is dependent on crystal size, structure, and homogeneity, it may be desirable for production methods for such nanocrystals to yield nanocrystals that have consistent size dispersion, structure, and optical qualities both within a preparation and across batches. In particular, the shape of nanocrystals strongly influences the near-IR optical spectra of the nanocrystals. Further, the surface plasmon resonance (SPR) of metal oxide nanocrystals is dependent on doping within the crystal lattice to introduce a free electron population. As such, the homogeneity of the nanocrystals is a limiting factor in the spectral tuning range of the SPR.

In particular, large scale nanocrystal production presents challenges in maintaining homogeneity and size dispersion, as mixing may not be homogeneous at the atomic level. Friction and drag forces at the interface between the reaction vessel and the reaction solution may reduce mixing of some reactants relative to others, thus yielding crystals with a wide range of sizes.

Further, in many commercial smart window applications, the electrochromic nanocrystals are layered into thin films onto a glass substrate via expensive physical vapor processes, such as sputtering or evaporation coating. In contrast, water soluble electrochromic nanocrystals may be applied to glass substrate via a wet press or other printing method. Wet chemical preparation methods have been developed that reduce agglomeration and amorphous material production, but typically involve synthesis in a hydrocarbon solvent containing a lipophilic ligand which becomes bound to the surface of the resultant nanocrystals.

To provide water soluble electrochromic nanocrystals using such preparation methods, the lipophilic ligand may be exchanged for a hydrophilic ligand. However, this may be an energetically unfavorable reaction. Batch methods may require a long time to even obtain a low yield. Surfactants may be used to create an emulsion of an aqueous and non-aqueous solution, but this does not guarantee homogeneity at the atomic level.

Aside from electrochromic nanocrystals, efficient ligand exchange is a problem in numerous other fields of nanoparticle research. Coordinating ligands bound to the surface of the nanoparticles may provide a wide variety of properties to the nanoparticles. However, attaching the functional ligands to the nanocrystals may cause difficulties. For example, certain nanocrystalline materials may bind their ligands tightly, making ligand exchange unfavorable.

Hence, the present invention is intended to provide nanocrystalline materials with uniform particle sizes and a small particle size distribution and a method for producing the nanocrystalline materials. The present invention is intended to further provide a method for producing And preparing the nanocrystalline materials bound to any functional ligands.

Solution to Problem

A method for producing metal oxide nanocrystals according to an embodiment of the present invention employs the following configurations.

(1) A method for producing metal oxide nanocrystals, comprising:
continuously flowing, into a continuous flow path, one or a plurality of nanocrystal precursor solutions each comprising one or more nanocrystal precursors dissolved in a non-polar solvent;
directing a segmenting gas into the continuous flow path to create a segmented reaction flow;
flowing the segmented reaction flow into a thermal processor;
heating the segmented reaction flow in the thermal processor to create a product flow; and
collecting metal oxide nanocrystals from the product flow.

(2) The method according to the item (1) above, further comprising:
mixing one or more metal salts with the non-polar solvent and a first coordinating ligand that is soluble in the non-polar solvent to prepare the nanocrystal precursor solutions.

(3) The method according to the item (2) above, wherein
the one or more metal salts comprise a polyatomic anion that includes one or more oxygen atoms.

(4) The method according to the item (2) or (3) above, wherein
the one or more metal salts are hydrates.

(5) The method according to any one of the items (2) to (4) above, wherein
the metal oxide nanocrystals comprise indium-tin oxide nanocrystals, and the one or more metal salts comprise at least one of indium acetate dehydrate and tin acetate.

(6) The method according to any one of the items (2) to (5) above, wherein
the metal oxide nanocrystals comprise cerium(IV) oxide nanocrystals, and the one or more metal salts comprise cerium ammonium nitrate.

(7) The method according to any one of the items (2) to (6) above, wherein
the non-polar solvent comprises 1-octadecene, and the first coordinating ligand comprises at least one of oleylamine and oleic acid.

(8) The method according to any one of the items (2) to (7) above, wherein
the collecting of the metal oxide nanocrystals comprises:
flowing the product flow to a ligand exchange reactor coupled within the continuous flow path;
exchanging the first coordinating ligand for a second coordinating ligand in the ligand exchange reactor; and
collecting metal oxide nanocrystals chemically bound to the second coordinating ligand.

(9) The method according to any one of the items (1) to (8) above, further comprising:
monitoring one or more properties of the product flow exiting the thermal processor; and
adjusting reaction parameters based on the one or more monitored properties.

(10) The method according to the item (9) above, wherein
the adjusting of the reaction parameters comprises adjusting the temperature of the thermal processor.

(11) The method according to any one of the items (1) to (10) above, wherein
the one or more nanocrystal precursor solutions are flowed into a micromixer to create a mixed reaction solution prior to introducing the segmenting gas.

(12) The method according to the item (11) above, wherein
the non-polar solvent is flowed into the micromixer in addition to the one or more nanocrystal precursor solutions using a metering pump in order to adjust a concentration of the one or more nanocrystal precursors in the mixed reaction solution.

The method for producing multi-element oxide nanocrystals according to an embodiment of the present invention employs the following configurations.

(13) A method for producing multi-element oxide nanocrystals, comprising:
flowing a first nanocrystal precursor solution into a micromixer, the first nanocrystal precursor solution comprising a first metallic salt nanocrystal precursor, a non-polar solvent, and a first coordinating ligand that is soluble in the non-polar solvent;
flowing a second nanocrystal precursor solution into the micromixer, the second nanocrystal precursor solution comprising a second metallic salt nanocrystal precursor, the non-polar solvent, and the first coordinating ligand, wherein at least one of the first metallic salt nanocrystal precursor and the second metallic salt nanocrystal precursor includes one or more oxygen atoms;
metering the first nanocrystal precursor solution and the second nanocrystal precursor solution at a predetermined ratio at the micromixer to create a mixed reaction solution;
flowing the mixed reaction solution into a continuous flow path at a first flow rate;
delivering a segmenting gas into the mixed reaction solution at a second flow rate to create a segmented reaction flow;
flowing the segmented reaction flow into a thermal processor;
heating the segmented reaction flow in the thermal processor to create a product flow; and
collecting multi-element metal oxide nanocrystals from the product flow downstream of the thermal processor.

(14) The method according to the item (13) above, further comprising:
monitoring one or more properties of the product flow exiting the thermal processor; and
adjusting one or more of the first and second flow rates based on the one or more monitored properties.

(15) The method according to the item (14) above, further comprising:
adjusting the predetermined ratio of the first nanocrystal precursor solution to a second nanocrystal precursor solution based on the one or more monitored properties.

(16) The method according to the item (14) or (15) above, wherein
the monitoring of one or more properties of the product flow comprises monitoring a distribution of sizes of multi-element metal oxide nanocrystals in the product flow.

(17) The method according to any one of the items (14) to (16) above, wherein
the monitoring of one or more properties of the product flow comprises monitoring optical properties of multi-element metal oxide nanocrystals in the product flow.

(18) The method according to any one of the items (14) to (17) above, further comprising:
excluding the product flow from the continuous flow path based on the one or more monitored properties.

(19) The method according to any one of the items (13) to (18) above, wherein
the collecting of multi-element metal oxide nanocrystals from the product flow downstream of the thermal processor comprises:
flowing the product flow to a ligand exchange reactor coupled within the continuous flow path;
exchanging the first coordinating ligand for a second coordinating ligand in the ligand exchange reactor; and
collecting multi-element metal oxide nanocrystals chemically bound to the second coordinating ligand.

A method for producing water soluble metal oxide nanocrystals according to an embodiment of the present invention employs the following configurations.

(20) A method for producing water soluble metal oxide nanocrystals, comprising:
flowing one or more nanocrystal precursor solutions each comprising one or more metallic salt nanocrystal precursors, a non-polar solvent, and a first coordinating ligand soluble in the non-polar solvent into a micromixer, wherein at least one of the one or more metallic salt nanocrystal precursors includes one or more oxygen atoms;
mixing the one or more nanocrystal precursor solutions in the micromixer to create a mixed reaction solution;
flowing the mixed reaction solution into a continuous flow path;
delivering a segmenting gas into the continuous flow path to create a segmented reaction flow;
flowing the segmented reaction flow into a thermal processor;
heating the segmented reaction flow in the thermal processor to create a product flow;
removing the segmenting gas from the product flow to create an initial metal oxide nanocrystal mixture;
flowing the initial metal oxide nanocrystal mixture to a mechanical high-shear mixture coupled in the continuous flow path;
flowing an aqueous ligand solution comprising a water soluble second coordinating ligand to the mechanical high-shear mixer;
creating a submicron emulsion of the initial metal oxide nanocrystal mixture and the aqueous ligand solution to exchange the first coordinating ligand for the second coordinating ligand; and
collecting a water soluble fraction comprising metal oxide nanocrystals chemically bound to the second coordinating ligand, output by the mechanical high-shear mixer.

The metal oxide nanocrystals according to an embodiment of the present invention employs the following configurations.

(21) Metal oxide nanocrystals wherein, when averages of particle diameter and coefficients of variance of the metal oxide nanocrystals are plotted on an X-Y coordinate system with an X-axis representing the average of particle diameter (nm) and a Y-axis representing the coefficient of variance (%), the coefficients of variance at the respective plotted points are smaller than coefficients of variance in a curve obtained by connecting values of coefficients of variance calculated at the respective averages of particle diameter when a standard deviation of particle diameter is 0.4 nm.

(22) Metal oxide nanocrystals wherein, when averages of particle diameter and coefficients of variance of the metal oxide nanocrystals are plotted on an X-Y coordinate system with an X-axis representing the average of particle diameter (nm) and a Y-axis representing the coefficient of variance (%), the coefficients of variance at the respective plotted points are smaller than coefficients of variance in a straight line passing through a point 1 (10 nm, 4.0%) and a point 2 (2.7 nm, 15%).

(23) The metal oxide nanocrystals according to the items (21) or (22) above, having an average of particle diameter of 20 nm or less.

(24) The metal oxide nanocrystals according to the item (21) or (22) above, having an average of particle diameter of 10 nm or less.

Advantageous Effects of the Invention

The present invention can provide nanocrystalline materials with uniform particle sizes and a small particle size distribution and a method for producing the nanocrystalline materials. The present invention can further provide a method for preparing the nanocrystalline materials bound to any functional ligands.

DESCRIPTION OF EMBODIMENTS

Examples are disclosed that relate to producing metal oxide nanocrystals. In one example, one or more nanocrystal precursor solutions may be introduced to a continuous flow path, each of the nanocrystal precursor solutions comprising one or more nanocrystal precursors dissolved in a non-polar solvent. A segmenting gas is directed into the continuous flow path, creating a segmented reaction flow. The segmented reaction flow is then flowed into a thermal processor, where it is heated for a duration, thereby creating a product flow. Metal oxide nanocrystals may then be collected from the product flow. The method may allow for rapid, reproducible, and scalable production of substantially homogenous nanocrystals with reduced size dispersion compared to batch methods.

Examples of nanocrystal synthesis and ligand exchange, which can be useful to solve the problems are disclosed herein. As described in more detail below, nanocrystals may be synthesized in non-aqueous solutions in a continuous flow process, and then may be made soluble in an aqueous solution by undergoing a surface functionalization change at a mechanical high-shear mixer.

Figure 1:
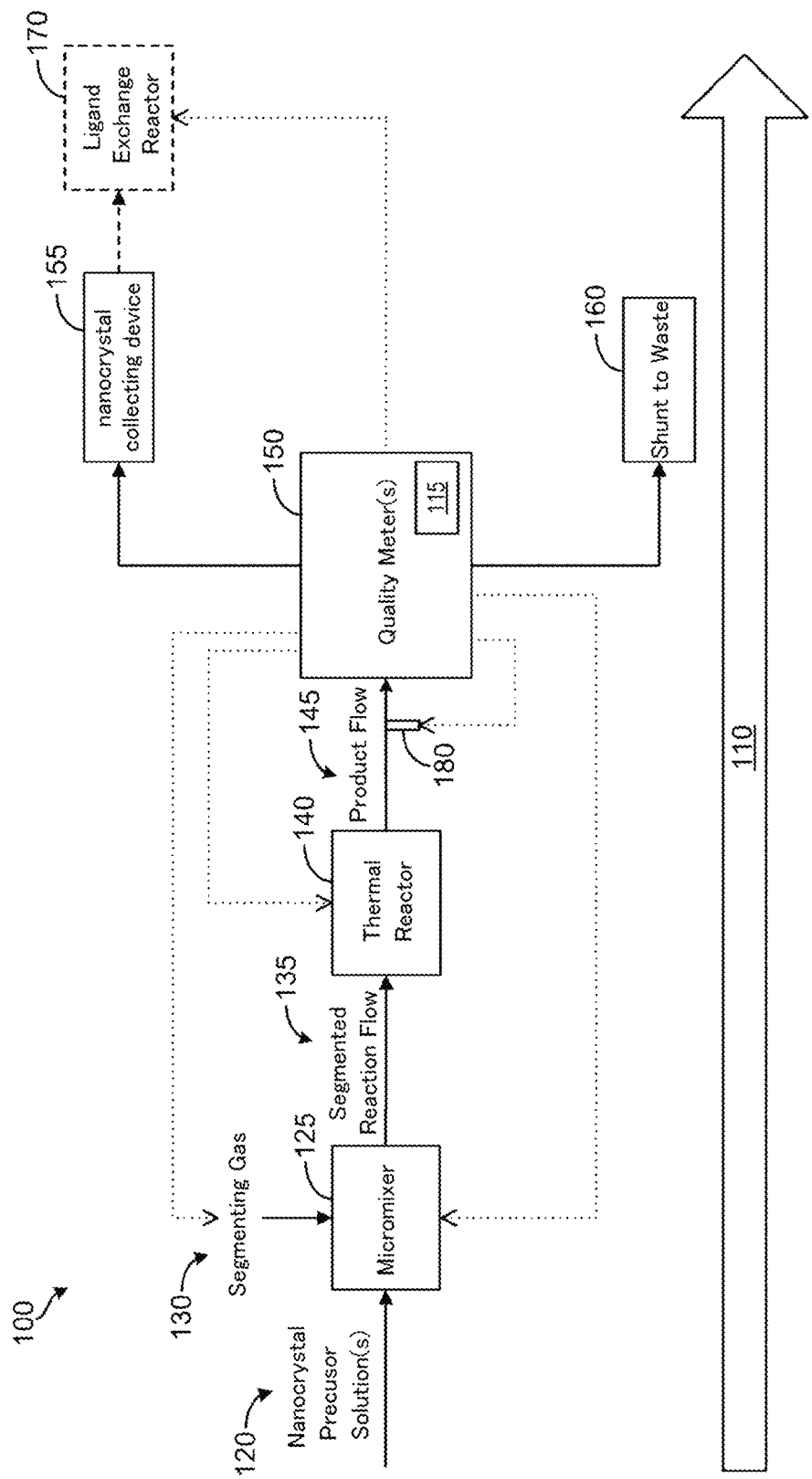
FIG. 1 schematically shows an example continuous flow reactor which may be utilized to synthesize nanocrystals.

FIG. 1 schematically shows an example continuous flow reactor 100 which may be utilized to synthesize nanocrystals. Continuous flow reactor 100 comprises continuous flow path 110. Continuous flow path 110 may comprise one or more flow tubes. The one or more flow tubes may include flow tubes running in parallel. The flow tubes may, at certain points in continuous flow path 110, merge or diverge. Some examples thereof will be described herein and with regard to FIG. 3. Each flow tube may comprise an inner diameter between 1/16" to 1", although smaller or larger diameter tubing may be used based on the applications. In the examples described herein, the reaction conditions are described for flow tubes having an inner diameter between 1/16" and 1/2". Flow rates of material through the continuous flow path may be regulated by one or more pumps, such as a peristaltic pump. The one or more pumps may be actuated by a controller, such as control system 115. Control system 115 may comprise one or more computing systems, and may be communicatively coupled to one or more sensors and one or more actuators, examples of which are discussed further herein.

At nanocrystal precursor solution introduction section 120, one or more nanocrystal precursor solutions are shown being introduced into continuous flow path 110. The nanocrystal precursor solutions may include one or more metal salts, such as a metal acetate, metal halide, or other salt that can be dissolved in an appropriate solvent for the continuous flow reaction. For example, the solvent may be a non-polar solvent. The nanocrystal precursor solutions may further include one or more first ligands. The first ligands may bind to the exterior of the nanocrystals, thus increasing their solubility in the solvent. In some examples, for example, where the resultant nanocrystal is a multi-element nanocrystal, two or more nanocrystal precursor solutions may be mixed together in an appropriate stoichiometric ratio to create a mixed precursor reaction solution.

Once prepared and introduced into continuous flow path 110, the nanocrystal precursor solutions may be flowed to micromixer 125, where they may be mixed into a substantially homogeneous mixed reaction flow. The continuous flow reactor may flow the precursor reaction solution into a continuous flow path comprising one or more flow tubes. The scale of the continuous flow reaction may be increased by forming the continuous flow path from multiple, parallel flow tubes.

At segmenting gas introduction section 130, a segmenting gas is introduced to the mixed reaction flow to segment the precursor reaction flow. For example, an inert gas, or a gas that is substantially immiscible in the precursor reaction solution solvent may be introduced. In this way, the continuous flow reaction is segmented into a plurality of micro-reactions. The segmentation allows for controlled flow of the reactants through the continuous flow reactor. Segment size and reaction flow rate may be indicated by a controller. The segmentation increases mixing within each micro-reaction. With an unsegmented reaction flow, material along the tube wall interface moves more slowly through the flow tube than does material in the center of the tube, and thus some material will spend a longer duration in the continuous flow reaction than other material. With segmented flow, the flow rate becomes more homogeneous for the reactants, and the micro-reaction is continuously mixed due to the drag incurred at the tube wall interface. As shown in FIG. 1, the segmenting gas is introduced to the mixed reaction flow at micromixer 125. However, in some examples, the segmenting gas may be introduced at a different location. For example, if an already mixed reaction flow is introduced to continuous flow path 110, the segmenting gas may be introduced at any point in the continuous flow path upstream of the thermal processor. In some examples, the segmenting gas may be introduced at a dedicated system between a mixing apparatus (e.g., a micromixer) and the thermal reactor.

The segmented reaction flow is transported to a thermal processor. The thermal processor is configured to be capable of controlling the temperature of the segmented reaction flow and for example, heats or cools the segmented reaction flow to the predetermined temperature. The thermal processor comprises, for example, a thermal reactor 140 and may introduce heat to a continuous flow reaction to stimulate creation of nanocrystals from nanocrystal precursors. This may include passing the segmented reaction flow through one or more thermal reactors (e.g., convection heater, near-IR heater, etc.). The controlled mixing incurred by the segmented reaction flow allows for the reaction temperature to be reduced compared to similar batch methods. Further, the residence time within the thermal processor may be significantly reduced. For example, the continuous flow reaction may be thermally processed for a duration on the order of 3-5 minutes, whereas batch methods require the reaction mixture to be heated for a duration on the order of 60 minutes. The reduced reaction time allows for a reduction in the coefficient of variance of the size of the resultant nanocrystals (e.g., surface to volume ratio). For electrochromic nanocrystals, and other nanocrystals with optical properties, different sized particles may result in different bias to enact their optical properties, and thereby may impact performance. Thus, the continuous flow reactor of FIG. 1 allows batch-to-batch consistency in nanocrystal size, bias, quality, etc.

The material resulting from thermal processing may be considered a product flow 145. The product flow comprises nanocrystals formed by the thermal reactor, for example. The product flow exiting thermal reactor 140 is then subject to metrology by one or more quality meters 150. Metrology may include measuring the optical and/or physical size properties of the product flow. For example, the product flow may be flowed through one or more in-line light absorbance spectrometers to determine optical properties, and one or more in-line light scattering spectrometers to determine physical size properties. If the measured properties of the product flow are within a predetermined range of specifications, continuous flow reactor 100 may divert the product flow to nanocrystal collecting device 155, where the nanocrystal products may be collected.

If the measured properties of the product flow are not within the predetermined range of specifications, continuous flow reactor 100 may shunt the product flow to waste device 160, the waste device 160 outputs and wastes the product flow to the outside of continuous flow reactor 100. Based on the measured properties of the product flow, one or more parameters of continuous flow reaction may be adjusted. For example, flow rates, precursor solution stoichiometry, segment size, and processing temperature may be adjusted. As the flow reaction is continuous, rapid, and the metrology is done in-line, the effects of the parameter adjustments may be gauged and iterated to fine-tune the reaction conditions without wasting an excess of material. By the parameter adjustments of production conditions, nanocrystal products having desired properties can be obtained.

Nanocrystal products that meet the prescribed specifications may be collected by removing the segmenting gas, and then precipitating the nanocrystal products in an organic solvent. The nanocrystal products then may be re-dissolved in an appropriate solvent for downstream applications. In some examples, continuous flow reactor 100 flow the collected nanocrystal products to a ligand exchange reactor 170. For example, the nanocrystals may be synthesized in a non-polar solvent in the presence of a lipophilic ligand, but the desired product may be a nanocrystal soluble in water. As such, the nanocrystal products may be collected by removing the segmenting gas, and then transported to ligand exchange reactor 170. An aqueous solution comprising a hydrophilic ligand may concurrently be flowed to ligand exchange reactor 170. At the ligand exchange reactor, an emulsion may be formed of the nanocrystal product in the non-polar solvent and the aqueous solution. This may thus promote exchange of the first, lipophilic ligand for the second, hydrophilic ligand on the surface of the nanocrystals. An aqueous fraction may then be collected from ligand exchange reactor 170, comprising nanocrystals bound to hydrophilic ligand.

In some examples, continuous flow reactor 100 may be utilized in the preparation and synthesis of metal oxide nanocrystals. Returning to nanocrystal precursor solution introduction section 120, one or more nanocrystal precursor solutions are shown being introduced to continuous flow path 110. The nanoprecursor solutions may comprise one or more nanocrystal precursors dissolved in a non-polar solvent. The nanocrystal precursor solutions may be prepared by mixing one or more metal salts with the non-polar solvent and a first coordinating ligand, the first coordinating ligand soluble in the non-polar solvent.

Figure 2A:
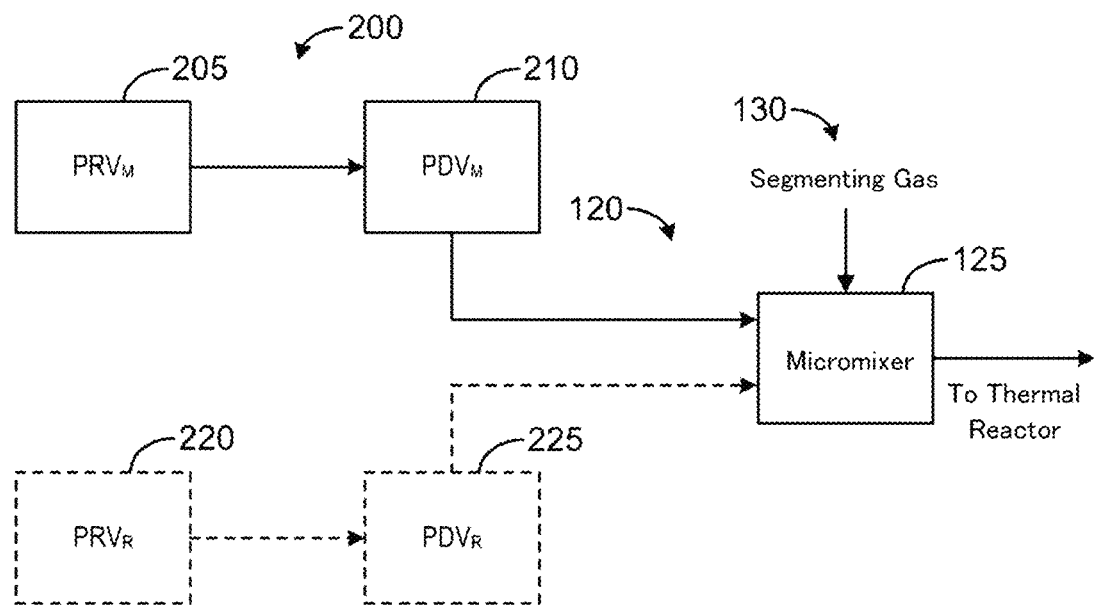
FIG. 2A schematically shows an example system for preparing and delivering nanocrystal precursor solutions to a continuous flow reactor.
Figure 2B:
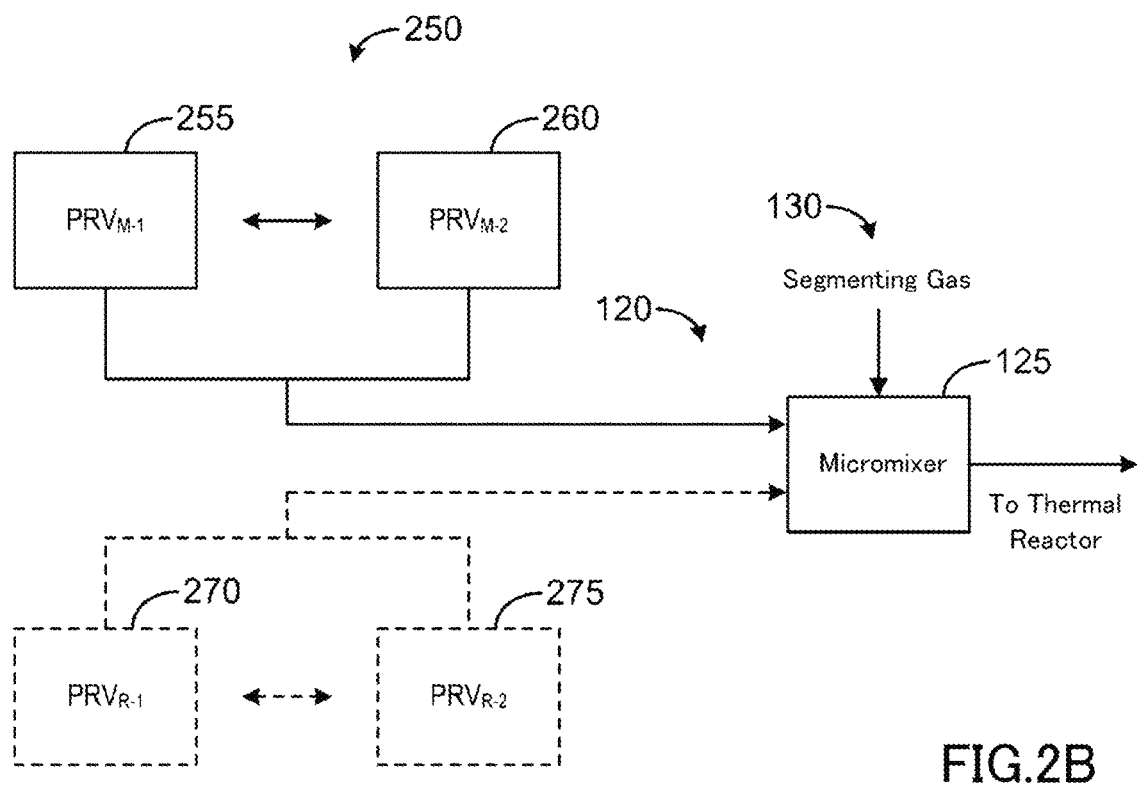
FIG. 2B schematically shows another example system for preparing and delivering nanocrystal precursor solutions to a continuous flow reactor.

FIGS. 2A and 2B schematically show example systems for preparing and delivering nanocrystal precursor solutions to a continuous flow reactor. FIG. 2A depicts nanocrystal preparation and delivery system 200, which may be used to provide one or more nanocrystal precursor solutions to micromixer 125. Nanocrystal preparation and delivery system 200 includes reaction vessel 205 ($PRV_M$) and delivery vessel 210 ($PDV_M$). In reaction vessel 205, the nanocrystal precursors may be reacted with a ligand and dissolved in a solvent. The resulting nanocrystal precursor solution may then be flowed to delivery vessel 210, and on to micromixer 125. When the nanocrystal precursor solution has been flowed to delivery vessel 210, reaction vessel 205 may then be used to prepare additional nanocrystal precursor solution. In this way, the continuous flow path can be continuously supplied with precursor solution.

For metal oxide nanoparticles, the nanocrystal precursors may include metal salts, such as acetates, halides, nitrates, carboxylates, other organic acid salts, and/or any salt that can be dissolved in the solvent. The solvent may be non-polar, such as 1-octadecene, or other solvents with a high boiling temperature that allow for the nanocrystal precursor solution to be exposed to high reaction temperatures while remaining in solution. The precursor solution may further include a first coordinating ligand soluble in the non-polar solvent. For example, one or more of oleylamine and oleic acid may be added to a 1-octadecene solution. This allows for a higher reaction temperature than with the metal salt anions alone. In this context, a "first coordinating ligand" may refer to a mixture of coordinating ligands, for example, a mixture of oleylamine and oleic acid. As described above, one or more of the metallic salt nanocrystal precursors may comprise a polyatomic anion that includes one or more oxygen atoms, such as an acetate, nitrate, or sulfate, and further, one or more of the metal salts may additionally or alternatively be a hydrated salt. In this way, the oxygen atoms from the polyatomic anion and/or the hydrating water molecules may be scavenged by the nanocrystal precursors to create the metal oxide nanocrystals.

A mixing of the precursors/components for the nanocrystal precursor solution can take place within reaction vessel 205 using a static mixer, such as a T-mixer, to ensure complete mixing of the precursors/components. Alternatively, a different type of mixer, such as an active stirrer, can be used such that a substantially homogenous solution is formed after exiting the reaction vessel.

In some examples, nanocrystal preparation and delivery system 200 may further comprise a second reaction vessel 220 ($PRV_R$) and second delivery vessel 225 ($PDV_R$). Second reaction vessel 220 and second delivery vessel 225 may function to provide a second nanocrystal precursor solution to micromixer 125. In this way, multi-element metal oxide nanoparticles may be formed from two nanocrystal precursor solutions. However, in some examples, a single nanocrystal precursor solution may comprise two or more metallic salt nanocrystal precursors. When two nanocrystal precursor solutions are used, the solutions may comprise the same solvent, and may further comprise the same coordinating ligand, or coordinating ligands with similar chemical properties. Similarly to the process described for reaction vessel 205 and delivery vessel 210, the nanocrystal precursors may be reacted with a ligand and dissolved in a solvent in reaction vessel 220. The resulting second nanocrystal precursor solution may then be flowed to delivery vessel 225, and on to micromixer 125. While the second nanocrystal precursor solution has been flowed to delivery vessel 225, reaction vessel 220 may then be used to prepare additional second nanocrystal precursor solution. In this way, the continuous flow path can be continuously supplied with precursor solution. The relative concentrations of the first and second nanocrystal precursor solutions may be controlled at micromixer 125. This will be described in detail further with regard to FIG. 3.

FIG. 2B depicts nanocrystal preparation and delivery system 250, which may be used to provide one or more nanocrystal precursor solutions to micromixer 125. Nanocrystal preparation and delivery system 250 includes first precursor reaction vessel 255 ($PRV_{M-1}$) and second precursor reaction vessel 260 ($PRV_{M-2}$). Optionally, nanocrystal preparation and delivery system 250 may include third precursor reaction vessel 270 ($PRV_{R-1}$) and fourth precursor reaction vessel 275 ($PRV_{R-2}$). Similar to nanocrystal preparation and delivery system 200, a nanocrystal precursor solution may be prepared in a reaction vessel. However, instead of flowing the nanocrystal precursor solution to a delivery vessel, the nanocrystal precursor solution is flowed directly to micromixer 125. For example, a nanocrystal precursor solution may be prepared in first precursor reaction vessel 255, and flowed directly to micromixer 125. Concurrently, a second batch of nanocrystal precursor solution may be prepared in second precursor reaction vessel 260. When first precursor reaction vessel 255 is empty or nearly empty, the flow of nanocrystal precursor solution may be switched from first precursor reaction vessel 255 to second precursor reaction vessel 260. While the nanocrystal precursor solution is being flowed from second precursor reaction vessel 260, first precursor reaction vessel 255 may then be used to prepare additional nanocrystal precursor solution, and vice-versa. In this way, the continuous flow path can be continuously supplied with precursor solution. Third precursor reaction vessel 270 and fourth precursor reaction vessel 275 may similarly be used in tandem to provide a continuous flow of a second nanocrystal precursor solution to the continuous reaction flow. Furthermore, in some examples, third precursor reaction vessel 270 and fourth precursor reaction vessel 275 can prepare a second nanocrystal precursor solution with different composition from the nanocrystal precursor solution prepared in first precursor reaction vessel 255 and the second precursor reaction vessel 260. This allows creation of multi-element metal oxide nanoparticles from two nanocrystal precursor solutions.

The following describes another example system for preparing a nanocrystal precursor solution and delivering the nanocrystal precursor solution to a continuous flow reactor. The present invention, however, is not limited to the following embodiments as they are and can be embodied by modifying or appropriately combining constituents in a range without departing from the scope thereof in the embodying stage.

Nanocrystal preparation and delivery system 200 and nanocrystal preparation and delivery system 250 each may be configured as a nanocrystal precursor solution supply unit comprising a first vessel and a second vessel and may be connected to a continuous flow path in a continuous flow reactor to introduce the delivered nanocrystal precursor solution to the continuous flow path.

The second vessel (for example, delivery vessel 210 in the example of FIG. 2A, reaction vessel 260 in the example of FIG. 2B) comprises a nanocrystal precursor solution prepared in advance. For the sake of description, this nanocrystal precursor solution is hereafter referred to as a nanocrystal precursor solution (0 order). The second vessel delivers the nanocrystal precursor solution (0 order) to the continuous flow path. The delivered nanocrystal precursor solution (0 order) is heated in a thermal processor provided on the flow path of the continuous flow path, thereby creating nanocrystals.

The nanocrystal precursor solution supply unit starts preparing a nanocrystal precursor solution with the same composition as but different preparation unit from the nanocrystal precursor solution (0 order) in the first vessel (reaction vessel 205 in the example of FIG. 2A, and reaction vessel 255 in the example of FIG. 2B) while supplying the nanocrystal precursor solution (0 order) as described above. This newly prepared nanocrystal precursor solution is hereinafter referred to as a nanocrystal precursor solution (1 order). In this implementation, the preparation may comprise, for example, dissolving a nanocrystal precursor in a solvent.

The nanocrystal precursor solution supply unit starts supplying the nanocrystal precursor solution (1 order) to the continuous flow path immediately after the nanocrystal precursor solution (0 order) in the second vessel falls below a certain amount or becomes empty. For example, in the example of FIG. 2A, the nanocrystal precursor solution (1 order) is delivered from the first vessel (reaction vessel 210) to the second vessel (delivery vessel 205), and the second vessel supplies the received nanocrystal precursor solution (1 order) to the continuous flow path. In the example of FIG. 2B, the form is switched to a form where the first vessel (reaction vessel 255) supplies the nanocrystal precursor solution (1 order) to the continuous flow path.

The shorter the time of this switching is, the smaller the condition variation can be. The time of this switching is completed within, for example, one minute and is most preferably controlled to be almost zero minute. After the completion of this switching, the nanocrystal precursor solution (1 order) is heated in the thermal processor, and creation of nanocrystals continues.

As described above, the nanocrystal precursor solution supply unit comprises a vessel for delivering a nanocrystal precursor solution and a vessel for preparing a nanocrystal precursor solution, and while supplying a nanocrystal precursor solution to a continuous flow path in a continuous flow reactor, a subsequent nanocrystal precursor solution can be prepared. This allows continuously supplying a nanocrystal precursor solution with stable quality to a continuous flow reactor.

Specifically, in the case where the continuous flow reactor comprises creating nanocrystals in the thermal processor, nanocrystals with uniform particle sizes and a small distribution can be obtained when the thermal processor can continuously heat the amount excessing the amount of the nanocrystal precursor solution prepared in advance. More specifically, although a nanocrystal precursor solution with stable quality can be supplied to the continuous flow reactor by preparing a predetermined amount of nanocrystal precursor solution in advance, the non-operational time of the thermal processor is generated every time when the prepared nanocrystal precursor solution is used up, and a variation in thermal processing conditions generated before after the non-operational time and the like may affect particle size uniformity of nanocrystals. The non-operational time of the thermal processor is not limited to the time in the state where the thermal processor is not operated and includes the time where the state of not supplying the nanocrystal precursor solution to the continuous flow path continues for a certain period of time although the thermal processor is operated. The heat balance in this state and that in the continuous operation state are largely different from each other, and this state and the continuous operation state are different in condition. This eventually be a cause of variation in heating temperature. In contrast, with the above-described configuration, an amount of nanocrystal precursor solution required in the continuous flow reactor can be continuously supplied without generating the non-operating time while preparing a predetermined amount of nanocrystal precursor solution in advance. Increasing the amount of nanocrystal precursor solution prepared in advance is considered to merely generate no non-operational time. However, the device is required to be bigger for the preparation and the delivery. Specifically, storing the prepared nanocrystal precursor solution for a long period of time may cause deterioration of the nanocrystal precursor solution, resulting in degradation of the quality of nanocrystals to be obtained. Moreover, a strict temperature control for a long period of time is required to prevent undesirable reaction such as deposition. Thus, the preparation of nanocrystal precursor solution is performed preferably within the range in which such problems do not occur.

In other examples, a nanocrystal precursor solution (2 order) may further be prepared as a subsequent preparation unit after the nanocrystal precursor solution (1 order) is started to be supplied to the continuous flow path. For example, in the example of FIG. 2A, in the first vessel (reaction vessel 205) having an empty space after delivering the nanocrystal precursor solution (1 order) to the second vessel, a nanocrystal precursor solution is again prepared. In the example of FIG. 2B, in the second vessel (reaction vessel 260) having an empty space after delivering the nanocrystal precursor solution (1 order) to the continuous flow path, a nanocrystal precursor solution is prepared. By repeatedly performing the same operation thereafter in each of the examples, the amount of the nanocrystal precursor solution, highly exceeding the capacities of the vessels in the nanocrystal precursor solution supply unit can be continuously supplied.

In some examples, the amount of the nanocrystal precursor solution in the second vessel is monitored. The monitoring can be performed using a liquid amount detector described below. Alternatively, the amount may be calculated from the inflow amount and outflow amount to the second vessel, measured with a flowmeter or may be assumed based on a predetermined flow rate and a measured operation time. The liquid amount detector is, for example, a switch-type level sensor that detects that the liquid level reaches (or falls below) a predetermined height or a continuous-type level sensor capable of detecting that position at which the liquid level is in a liquid level variation range.

When the amount of the nanocrystal precursor solution in the second vessel falls below a predetermined value, a nanocrystal precursor solution to be used subsequently is started to be prepared in the first vessel. The predetermined value is preferably larger than zero and is particularly preferably the value at which the time of being capable of maintain the delivery of the nanocrystal precursor solution from the second vessel is not shorter than the time required to prepare a subsequent nanocrystal precursor solution in the first vessel. As described above, the above-mentioned deterioration of the nanocrystal precursor solution over time and the increase in burden of managing the nanocrystal precursor solution can be prevented by starting preparation of a nanocrystal precursor solution in a first vessel based on the amount of the nanocrystal precursor solution in the second vessel.

In some examples, nanocrystal preparation and delivery system 200 are preferably configured to be capable of independently controlling the inflow amount from reaction vessel 205 to delivery vessel 210 per unit time and the delivery amount from delivery vessel 210 to continuous flow path 110 per unit time. In the case where delivery vessel 210 is connected to continuous flow path 110 in continuous flow reactor 100, the delivery amount to the outside of delivery vessel 210 may be regarded as the supply amount of the nanocrystal precursor solution from delivery vessel 210 to continuous flow path 110.

In some examples, the nanocrystal precursor solution created in the first vessel is delivered to the second vessel, and the second vessel receives the nanocrystal precursor solution created in the first vessel and supplies the received nanocrystal precursor solution to the continuous flow path. At that time, the nanocrystal precursor solution delivered from the first vessel and the nanocrystal precursor solution remaining in the second vessel may be mixed in the second vessel. The delivery of the nanocrystal precursor solution created in the first vessel to the second vessel may be started after the second vessel becomes empty or almost empty. However, the nanocrystal precursor solution is preferably started to be delivered to the second vessel while the amount of the nanocrystal precursor solution remaining in the second vessel is larger than the predetermined amount. Even when the nanocrystal precursor solution that is created firstly and remains in the second vessel and the nanocrystal precursor solution created secondly in the first vessel after the creation of the first nanocrystal precursor solution are prepared by the same method to have the same composition, a slight difference due to variations may be included. In such case, by mixing the nanocrystal precursor solution created firstly and the nanocrystal precursor solution created secondly in the second vessel, an averaged nanocrystal precursor solution can be obtained. In this case, the mixing ratio (the value obtained by dividing the amount of the nanocrystal precursor solution remaining in the second vessel at the time of mixing by the amount of the nanocrystal precursor solution delivered from the first vessel to the second vessel at the time of mixing) is preferably in the range of 0.01 times or more to 10 times or less, particularly preferably in the range of 0.1 times or more to 1 time or less. The volumetric capacity of the delivery vessel 210 may be higher than that of the reaction vessel 205. Moreover, the delivery vessel 210 may comprises a mixer. The type of the mixer is not limited, and for example, a static mixer or an active mixer as in reaction vessel 205 can be applied to the mixer.

Reaction vessel 205 and/or delivery vessel 210 each may be configured to be capable of blocking an inside space from outside air. Delivery vessel 210 may be configured to be further capable of filling its inside space with the nanocrystal precursor solution and any filling fluid and/or depressurizing or pressurizing the inside space. With this configuration, generation of undesirable reaction or change in nanocrystal precursor solution can be prevented. Alternatively, the filling fluid may be a reactive fluid that is expected to be reactive to a desirable reaction. In some examples, the filling fluid is immiscible and/or non-reactive gas to the nanocrystal precursor solution and may be inactive gas such as nitrogen or argon. In other examples, the filling fluid may be mixed air containing oxygen and such as dry air. The filling fluid may be selected as appropriate from them according to the nanocrystal precursor solution to be applied and the nanocrystals to be produced.

In some examples, nanocrystal preparation and delivery system 200 comprises two or more nanocrystal precursor solution supply units. In this case, in each of the two or more nanocrystal precursor solution supply units, a nanocrystal precursor solution with the same composition may be created and may be delivered to the continuous flow path or a nanocrystal precursor solution with different composition may be created and may be delivered to the continuous flow path. The continuous flow path in the continuous flow reactor preferably comprises a mixer for mixing the nanocrystal precursor solution delivered from the nanocrystal precursor solution supply unit.

In some examples, supplying the nanocrystal precursor solution from the second vessel to the continuous flow path may be switched to supplying the nanocrystal precursor solution from the first vessel to the continuous flow path. The nanocrystal precursor solution created in the first vessel is then delivered to the continuous flow path, and a nanocrystal precursor solution with the same composition is then newly created as a different batch in the second vessel.

In other example, in nanocrystal preparation and delivery system 250, at least one of first precursor reaction vessel 255 and second precursor reaction vessel 260, preferably both of them comprises a liquid amount detector as in delivery vessel 210. Moreover, at least one of first precursor reaction vessel 255 and second precursor reaction vessel 260, preferably both of them may be configured to be capable of blocking an inside space from outside air as in delivery vessel 210. Furthermore, at least one of first precursor reaction vessel 255 and second precursor reaction vessel 260 or both of them may be configured to be capable of filling its inside space with the nanocrystal precursor solution and any filling fluid and/or depressurizing or pressurizing the inside space as in delivery vessel 210. When delivery system 250 further comprises third precursor reaction vessel 270 and a fourth precursor reaction vessel 275 in preparation of nanocrystals, at least one of these precursor reaction vessels, preferably both of them may be comprised of the above-described configuration as in delivery vessel 210, for example, a liquid amount detector.

Moreover, in some examples, nanocrystal preparation and delivery system 250 may further be comprised of a second nanocrystal precursor solution supply unit configured to supply a second nanocrystal precursor solution having different composition from the nanocrystal precursor solution created in the first vessel and the second vessel.

Returning to FIG. 1, when the one or more nanocrystal precursor solutions have been prepared and introduced to continuous flow path 110 at nanocrystal precursor solution introduction section 120, they are then flowed along the continuous flow path to micromixer 125. After the nanocrystal precursor solutions are merged in micromixer 125, thereby creating a mixed reaction solution (a plurality of precursor solutions are introduced), segmenting gas is introduced at segmenting gas introduction section 130, and segmented reaction flow 135 thus can be created. Segmented reaction flow 135 may then be flowed along continuous flow path 110 to thermal reactor 140.

Figure 3A:
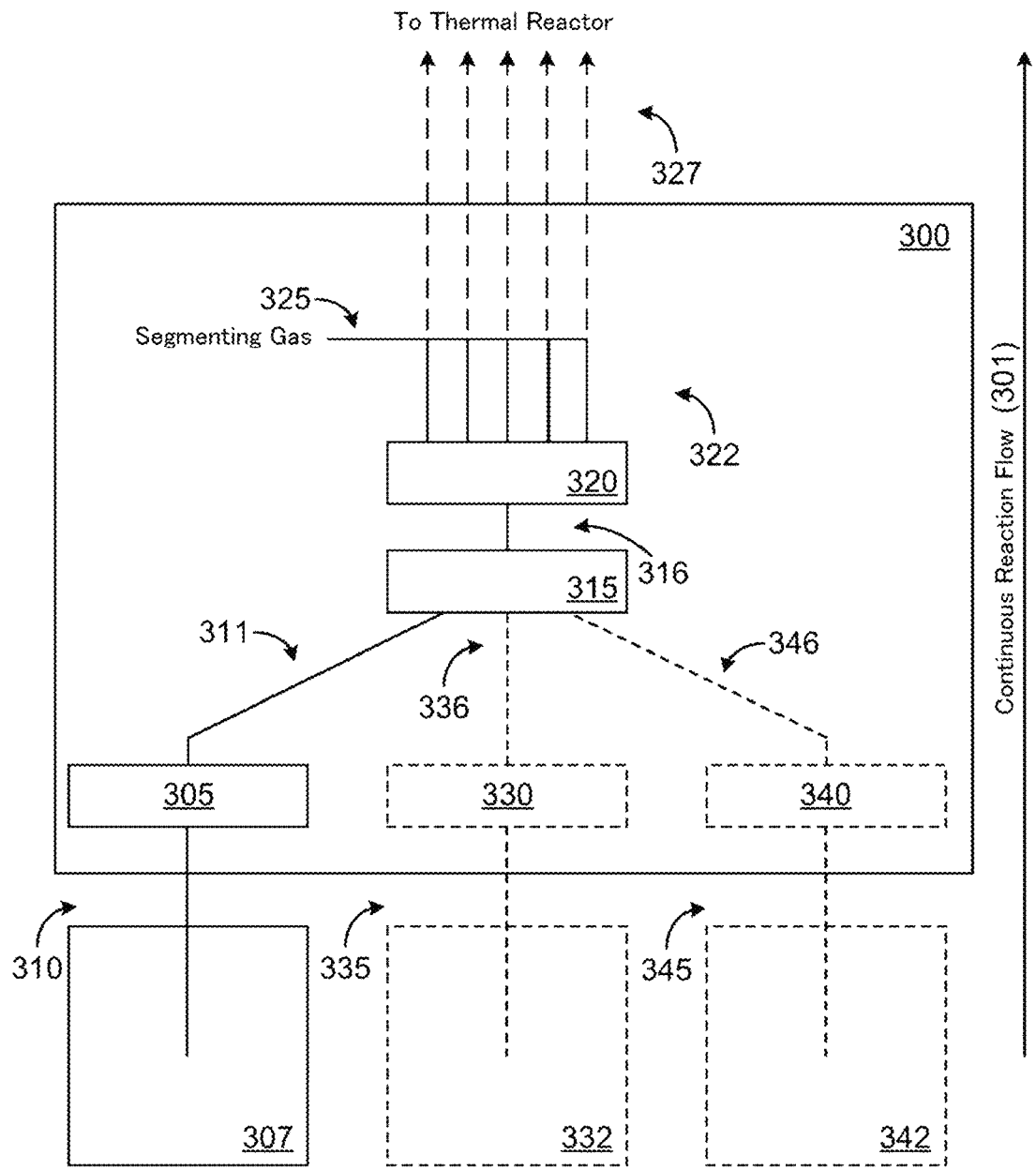
FIG. 3A schematically shows example micromixers for creating a segmented reaction flow.

In FIG. 3A, an example micromixing system 300 is schematically shown which may be utilized for creating a segmented reaction flow. Micromixing system 300 may be situated within a continuous flow path 301. Micromixing system 300 comprises a metering pump 305 coupled to a precursor delivery vessel 307 comprising a nanocrystal precursor solution via draw conduit 310. The desired concentration of precursors is introduced into the flow path 311 by metering pump 305. Metering pump 305 may be a peristaltic pump, syringe pump, diaphragm pump, or other appropriate pump configured to dispense the desired quantity of nanocrystal precursor solution into input flow path 311. The input flow paths flow nanocrystal precursor solution to mixer 315.

At mixer 315, the nanocrystal precursor solution is mixed into a substantially homogeneous mixed reaction solution. For example, the mixed reaction solution may be mixed to a predetermined mixing quality (e.g., >95%) in order to provide a substantially homogenous solution for segmentation and thermal processing. Mixing quality may be evaluated using computational fluid dynamics (CFD) and may be determined for a particular mixing environment, a particular solution composition within the mixing environment, and/or for each unique use of the mixer system. Mixing quality may be determined empirically and/or through computational modeling. A desired mixing quality may be used to adjust a duration precursor solutions are maintained within a mixing environment, a mixing parameter (such as a mixing speed), and/or a property of the mixing environment (e.g., increase or decrease turbulence by extending/retracting walls into the mixing environment).

The mixed solution may then be flowed out of mixer 315 via solution path 316, and then flowed into distributor 320. Distributor 320 outputs the mixed solution into parallel flow paths 322. Five parallel flow paths are shown in this example, but either a greater or lesser number of parallel flow paths may be used. Further, a single flow path may be used without any distributor in some implementations. In some scenarios, the distributor may output the mixed solution into one or more, but not all of the flow paths connected to the distributor. The parallel flow paths comprise a first section between the distributor and the thermal processor, and may further comprise a segmenting gas introduction section configured to introduce a segmenting gas into the first section of the parallel flow paths to segment a flow of the nanocrystal precursor solution. In the example shown in FIG. 3A, segmenting gas is introduced to the parallel flow paths at 325, yielding segmented reaction flow 327, which may then be flowed to the thermal reactor along continuous flow path 301. As described above, by mixing the nanocrystal precursor solution introduced into the continuous flow path with a mixer to create a mixed solution and diverging the mixed solution into a plurality of parallel flow path via a distributor, a difference in reaction flow flowing in each parallel flow path can be small. As described above, when the plurality of parallel flow paths each comprises a segmenting gas introduction section after the mixed solution is introduced into the plurality of parallel flow paths and before the mixed solution is flowed into the thermal reactor, a stable segmented reaction flow can be obtained.

The following describes preferred embodiments of the flow path before and after the parallel flow paths in further detail. This, however is not limited to the following embodiments as they are and can be embodied by modifying or appropriately combining constituents in a range without departing from the scope thereof in the embodying stage.

When the cross-sectional areas of planes of a plurality of parallel flow paths, formed of n parallel flow paths (n is a natural number of 2 or more), perpendicular to the direction in which the mixed solution flows, are represented by $S1$, $S2, \ldots$, and $Sn$, the $S1$, $S2, \ldots$, and $Sn$ are preferably nearly equal to each other. Being nearly equal to each other means that, when an average of the $S1$, $S2, \ldots$, and $Sn$ is represented by $Sa$, each of the $S1$, $S2, \ldots$, and $Sn$ is larger than 0.9 times the $Sa$ and is smaller than 1.1 times the $Sa$. With this configuration, a distribution of residence times in the respective parallel flow paths can be small.

When the cross-sectional areas of the parallel flow paths are partially different from each other because of their sections, the cross-sectional areas of the parallel flow paths at any position at which the lengths of the flow paths from the distributor are nearly equal to each other may be the $S1$, $S2, \ldots$, and $Sn$. Any position may be, for example, the midpoint position between the distributor and the segmenting gas introduction section.

Moreover, when the cross-sectional area of the plane of solution path 316 that flows the mixed solution to distributor 320, perpendicular to the direction in which the mixed solution flows, is represented by $Sb$, the $Sb$ is preferably larger than 0.9 times the $Sa$. Even if the $Sb$ is smaller than 0.9 times the $Sa$, the mixed solution can be stably supplied to the parallel flow paths by increasing the flow velocity (the amount of the mixed solution flowing in solution path 316 per unit time). However, when the $Sb$ is larger than 0.9 times the $Sa$, an increase in flow rate due to a change in viscosity of the mixed solution can be prevented, for example.

Moreover, the $Sb$ is preferably smaller than the sum of the cross-sectional areas of the plurality of parallel flow paths, i.e., n (the number of the parallel flow paths) times the $Sa$, more preferably smaller than 0.7 times a value, which is n times the $Sa$. With this configuration, generation of a distribution of the concentrations in the parallel flow paths due to a distribution of the concentrations of the mixed solution at the respective positions in the planes including the cross-sectional area $Sb$ of solution path 316 can be prevented.

Alternatively, the $Sb$ may be the same as n times the $Sa$ or more. By relatively reducing the $Sa$, i.e., limiting the diameter of each of the parallel flow paths to a certain value or less, segmentation with superior accuracy can be achieved and/or a stable segmented reaction flow can be obtained.

Solution path 316 may be configured of a plurality of solution paths, and in this implementation, the cross-sectional area Sb may be replaced with the sum of the cross-sectional areas of the plurality of solution paths 316.

Generally, decreasing the length of each flow path leads to ease of strict temperature control. However, it is preferred that, considering the accuracy of processing and assembly and the limitation of arrangement, a configuration that is most suitable under the give conditions is selected.

In some examples, in the plurality of parallel flow paths, when an average of the lengths of the parallel flow paths from the distributor to the segmenting gas introduction section is represented by La, and an average of the lengths of the parallel flow paths from the segmenting gas introduction section to the thermal processor is represented by Lb, the Lb is set to be larger than the La. By performing the segmentation at a position near the thermal processor, a segmented reaction flow with superior accuracy can be introduced to the thermal processor.

In other examples, the La is preferably set to be smaller than the Lb. As described below, the mixing can be improved by the segmentation. Thus, by performing the segmentation in the vicinity of the distributor on purpose, the mixing can be improved also in the flow path from the segmenting gas introduction section to the thermal processor. Specifically, by setting the La to be 10% or less, more preferably 5% or less of the Lb, the effect of improving the mixing can be further enhanced. Specifically, in the device by which a stable segmentation state can be obtained or under the conditions under which a stable segmentation state can be obtained, decreasing the La to the extent possible is favorable.

Moreover, when the length of the solution path from the mixer to the distributor is represented by Lc, the effect of improving the mixing caused by the segmentation can be easily obtained in the same manner as described above by setting the Lc to be smaller than the Lb.

Based on the metrology of the product flow exiting the thermal reactor, the back pressure and flow rate may be adjusted at the metering pump, the mixer, and/or the distributor. Further, in addition to the one or more nanocrystal precursor solutions, solvent may be flowed into the micromixer using a metering pump in order to adjust a concentration of the one or more nanocrystal precursors in the reaction solution. For example, micromixing system 300 may optionally include second metering pump 330, shown coupled to a solvent delivery vessel 332 via draw conduit 335. Metering pump 330 may then flow solvent into input flow path 336 at a commanded rate.

In some scenarios, no solvent may be flowed into input flow path 336 while nanocrystal precursor solution is flowed into flow paths 311. Solvent flow may be commanded responsive to metrology indicating that the concentration of nanocrystal precursors is too high. In other scenarios, solvent may be flowed by default into flow paths 336 while nanocrystal precursor solution is flowed into flow paths 311, and the flow rate of solvent may be reduced or terminated responsive to metrology indicating that the concentration of nanocrystal precursors is too low. For example, the nanocrystal precursor solution may be prepared to have a concentration of nanocrystal precursors that is greater than the stoichiometric concentration for a particular reaction. Solvent may then be metered into the continuous flow path to bring the concentration of nanocrystal precursors to the stoichiometric concentration. In this way, the concentration of nanocrystal precursors may be increased or decreased responsive to metrology by adjusting the flow rate of solvent.

In some examples, solvent delivery vessel 332 may include a solution including the solvent and one or more coordinating ligands, water, oxygen containing anions, and/or other reaction components. In some examples, multiple solvent delivery vessels may be coupled to micromixing system 300 via one or more metering pumps. Each of the multiple solvent delivery vessels may comprise a unique solution of solvent and one or more reaction components at predetermined concentrations. In examples where one or more reaction components are added to the solvent, a solvent reaction vessel may be coupled to each solvent delivery vessel, in configurations similar to those shown in FIGS. 2A and 2B for precursor delivery vessels and precursor reaction vessels.

In some examples, multi-element metal oxide nanocrystals may be synthesized by flowing two or more nanocrystal precursor solutions into micromixing system 300. For example, micromixing system 300 may optionally include third metering pump 340, shown coupled to a second nanocrystal precursor solution delivery vessel 342 via draw conduit 345. Metering pump 340 may then flow the second nanocrystal precursor solution into flow paths 346 at a commanded rate. In this configuration, the relative concentrations of the two nanocrystal precursor solutions may be controlled by adjusting flow rates at metering pumps 305 and 340, while the overall concentration of the reaction solution may be controlled by adjusting the flow rate of solvent at metering pump 330.

The lengths of the flow paths from the respective metering pumps to the mixer may be different from each other as shown in FIG. 3A. In other examples, the length of the flow path 311 from the metering pump to the mixer may be approximately equal to the length of flow path 336 from the metering pump to the mixer. Being approximately equal to each other means that the length of each flow path is larger than 0.9 times and smaller than 1.1 times the average of the lengths of the flow paths. In the implementation of the micromixing system further comprising flow path 346, the lengths of the flow paths 311, 336, and 346 from the metering pump to the mixer may be approximately equal to each other. With this configuration, the temperature of the fluid passing through each flow path can be easily controlled, variations in mixing ratio immediately after the start of delivering the fluid.

In this example, a single solvent delivery vessel is coupled to mixer 315. However, in other configurations, each nanocrystal precursor solution delivery vessel may be paired with a dedicated solvent delivery vessel, or a dedicated metering pump coupled to a single solvent delivery vessel. In such examples, the flow path carrying the first nanocrystal precursor solution and a first flow path carrying solvent may merge at a first junction, while the flow path carrying the second nanocrystal precursor solution and a second flow path carrying solvent may merge at a second junction. The first and second junctions may be upstream of mixer 315. In other configurations, the first nanocrystal precursor solution may be mixed with solvent at a first pre-mixing device, and the second nanocrystal precursor solution may be mixed with solvent at a second pre-mixing device. The resulting pre-mixed solutions may then be flowed to mixer 315 for mixing into a mixed reaction solution. Mixer 315 may include pre-mixing compartments as well as a primary mixing compartment downstream of the pre-mixing compartments. Other configurations may be used to allow for the adjustment of relative and absolute concentrations of nanocrystal precursors in the mixed reaction flow.

Figure 3B:
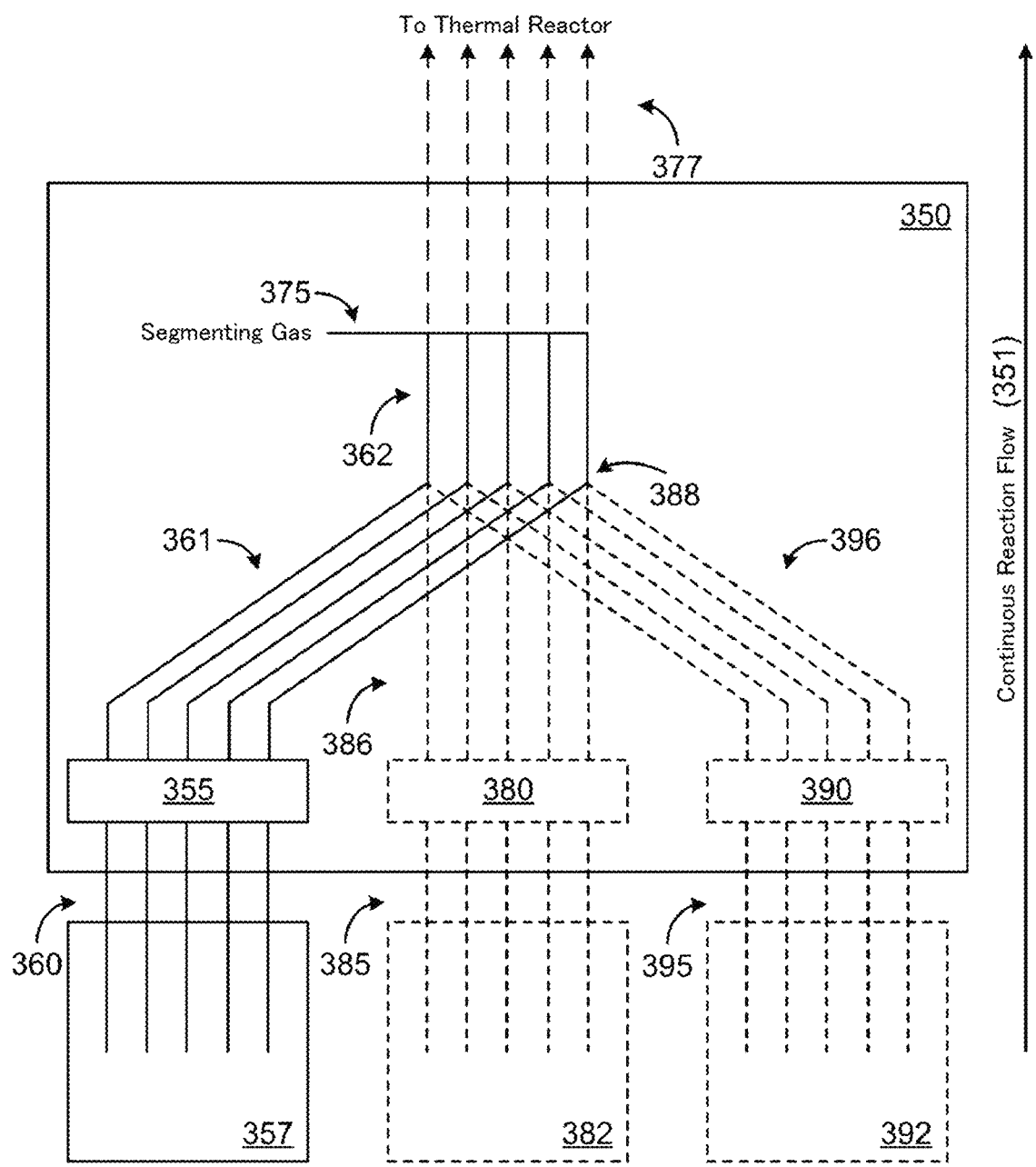
FIG. 3B schematically shows another example micromixers for creating a segmented reaction flow.

While metering pumps 305, 330, and 340 are shown as single-channel pumps, multi-channel pumps may be used in other configurations. One such configuration is shown in FIG. 3B. In FIG. 3B, an example micromixing system 350 which may be utilized for creating a segmented reaction flow is schematically shown. Micromixing system 350 may be situated within a continuous flow path 351. Micromixing system 350 comprises a metering pump 355 coupled to a precursor delivery vessel 357 via draw conduits 360. The desired concentration of precursors is introduced into the flow paths 361 by metering pump 355. Segmenting gas is introduced to the flow paths at 375, yielding segmented reaction flow 377, which may then be flowed to the thermal reactor along continuous flow path 351.

In this configuration, metering pump 355 is a multi-channel pump, and is shown coupled to five draw conduits 360. Metering pump 355 then outputs the nanocrystal precursor solution into five flow paths 361. However, more or fewer draw conduits and flow paths may be used depending on the application. In some examples, one or more draw conduits may be coupled between the precursor delivery vessel and the metering pump, which may output the nanocrystal precursor solution into a number of flow paths that is greater than the number of draw conduits. Where multiple flow paths are included, the flow paths may be controlled to be equivalent in back pressure and flow rate. This enables faster processing of the material, allowing for reduced residence time for the formation of nanoparticles and decreasing COV by eliminating thermal gradients within the fluid line.

Solvent may be flowed into the micromixer using a metering pump in order to adjust a concentration of the one or more nanocrystal precursors in the reaction solution. For example, micromixing system 350 may optionally include second metering pump 380, shown coupled to a solvent delivery vessel 382 via draw conduits 385. Metering pump 380 may then flow solvent into flow paths 386 at a commanded rate.

Flow paths 386 are shown merging into flow paths 361 at junctions 388. Junctions 388 and the segments (362) of flow paths 361 extending from junctions 388 to the introduction of segmenting gas at 375 may be configured to promote mixing of the merged solution and solvent. For example, the junctions may be configured to promote turbulent flow at the inlets of segments 362, and/or segments 362 may have an increased inner surface roughness to promote mixing. Once the reaction solution is thoroughly mixed, segmenting gas may be introduced to create a segmented reaction flow, which may be sent to the thermal reactor in multiple, parallel flow tubes.

In some examples, multi-element metal oxide nanocrystals may be synthesized by flowing two or more nanocrystal precursor solutions into micromixing system 350. For example, micromixing system 350 may optionally include third metering pump 390, shown coupled to a second nanocrystal precursor solution delivery vessel 392 via draw conduits 395. Metering pump 390 may then flow the second nanocrystal precursor solution into flow paths 396 at a commanded rate. Flow paths 396 then merge with flow paths 361 and flow paths 386 at junctions 388.

In this configuration, the relative concentrations of the two nanocrystal precursor solutions may be controlled by adjusting flow rates at metering pumps 355 and 390, while the overall concentration of the reaction solution may be controlled by adjusting the flow rate of solvent at metering pump 380. However, in other configurations, each nanocrystal precursor solution delivery vessel may be paired with a dedicated solvent delivery vessel, or a dedicated metering pump coupled to a single solvent delivery vessel. In such examples, the flow paths carrying the first nanocrystal precursor solution and a first set of flow paths carrying solvent may merge at a first set of junctions, while the flow paths carrying the second nanocrystal precursor solution and a second set of flow paths carrying solvent may merge at a second set of junctions. The flow path segments extending from the first and second set of junctions may then merge downstream at a third set of junctions, whereupon the precursor solutions may be mixed within flow path segments before segmenting gas is introduced.

Various combinations and permutations of delivery vessels, metering pumps, draw conduits, flow paths, flow path segments, junctions, mixers, and distributors may be used to allow for multiple nanocrystal precursor solutions to be combined into a mixed reaction flow, and to allow for the adjustment of relative and absolute concentrations of nanocrystal precursors in the mixed reaction flow.

By using a flow path comprising multiple flow tubes in parallel, the scale of the reaction may be increased while maintaining the reaction conditions that would occur in a single flow tube. This may allow for the consistency of flow rates and thermal reactor residence time. While larger tubes (>1") may be used, segmentation is hindered in larger tubes. However, the segmentation limits depend on the surface tension and viscosity of the reaction solution. Increased tube diameters may be enabled by adjusting one or more of the flow rates, tube material, surface wettability between the tube/solution, surface energy of the tube/solution, segmentation gas composition, system back pressure, temperature of the thermal reactor, or other properties of the continuous flow reactor and/or reactants.

Figure 4:
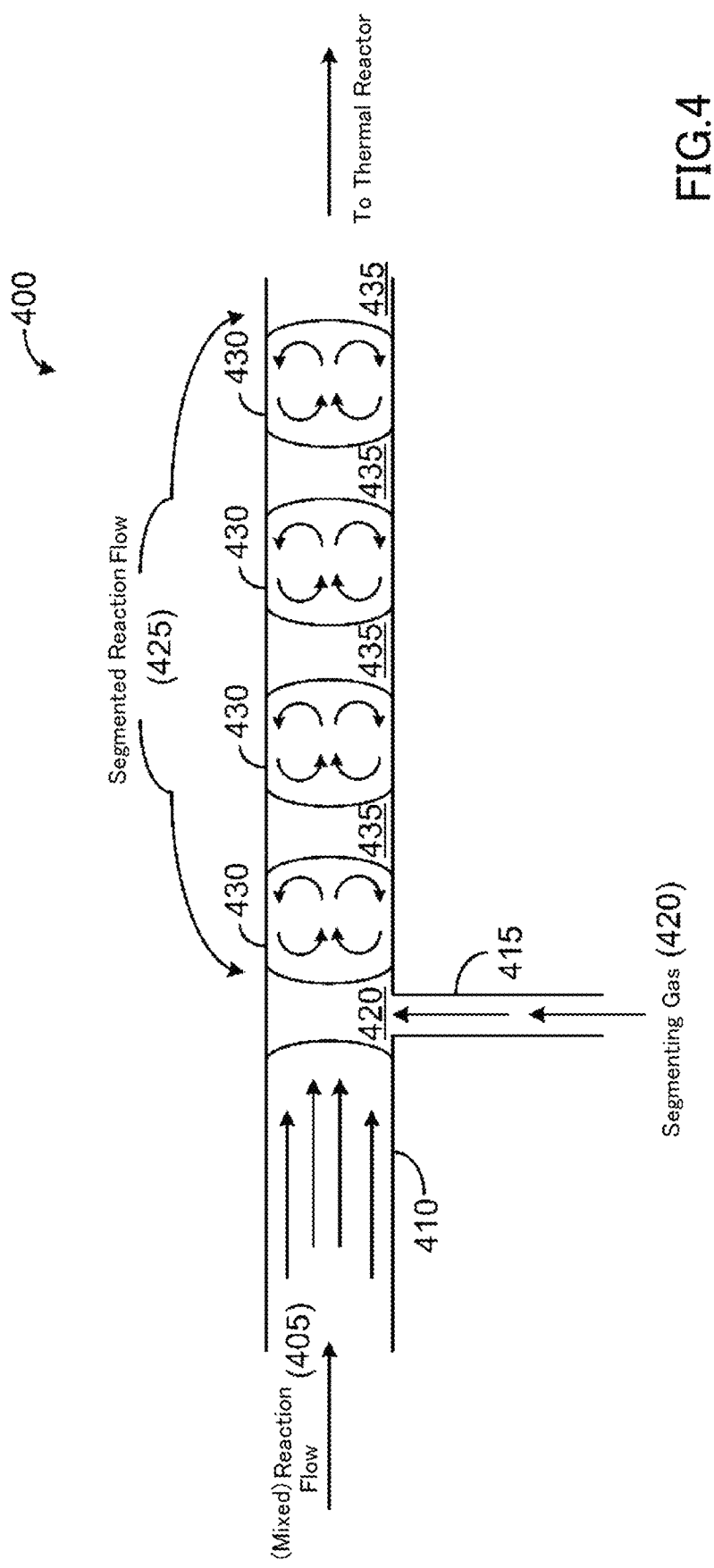
FIG. 4 schematically shows an example segmented reaction flow.

FIG. 4 schematically shows an example system 400 for generating a segmented reaction flow. A (mixed) reaction flow 405 is flowed through flow path 410. Flow path 410 may comprise one or more flow tubes, as shown in FIG. 3, though only one flow tube is shown for simplicity. Flow path 410 may be coupled to a source of segmentation gas via segmentation channel 415. Each flow tube comprised in flow path 410 may be individually coupled to the source of segmentation gas via a dedicated segmentation channel. Segmenting gas 420 may be introduced into reaction solution 405 at discrete intervals, thereby creating a segmented reaction solution 425 comprising a plurality of micro-reactions 430 separated by plugs 435 of segmenting gas 420.

Segmenting gas 420 may be an inert gas, such as nitrogen or argon, or may be a gas that is substantially immiscible in the reaction solvent. In some cases, air, or another gas comprising oxygen may be used as the segmenting gas, which may allow the nanocrystal precursors to scavenge oxygen from the segmenting gas in the formation of metal oxide nanocrystals. Segmenting gas 420 may be introduced continuously, at a flow rate based on the viscosity of the reaction solution, thereby allowing for discrete plugs and micro-reactions to create. A reduced flow rate may result in turbulent flow or phase separation flow, rather than plugged, segmented flow. In some examples, the segmenting gas may be introduced in discrete bursts, the bursts timed to create micro-reactions with a specified length and volume. For a horizontal flow path, the segmenting gas may be introduced from below the flow tube (as depicted in FIG. 4) or may be introduced from the side of the flow tube. Introducing the segmenting gas from above the flow tube may, in some circumstances, cause the segmenting gas to create a bubble which remains at the top of the flow tube, thus not segmenting the reaction flow.

By segmenting the reaction flow, the reaction solution may experience improved mixing as compared to non-segmented flow. Friction at the inner surface of the flow tube causes drag on the reaction solution along the walls of the tube, thereby causing material along the walls to travel much slower than material in the middle of the tube. Segmentation creates a continuous flow which is forced to travel at a constant speed. The friction imparted by the flow tube wall thus induces a vortex within each micro-reaction, allowing for turbulent mixing. Mixing of the reaction solution may be further enhanced by increasing the surface roughness on the interior surface of the flow tube.

By increasing the mixing of the reaction solution, the resultant nanocrystals have a reduced size coefficient of variance (COV). Without segmentation, material along the side wall which travels slower through the flow tube may react for a longer duration, thus creating larger nanocrystals than are created from material in the middle of the tube, and leading to an increased COV. Indeed, micro-reactions with increased length and volume have reduced mixing and increased COV. As such, the flow rate of the segmentation gas may be regulated to keep the distance between segmenting plugs below a threshold based on the viscosity and surface tension of the solvent and the diameter of the tube. For example, the COV of size of nanocrystals synthesized in a 1-octadecene solution flowed through a 1/16" tube may be reduced by maintaining micro-reactions less than 1" in length compared to longer segments.

Further, segmentation may reduce of material deposition on the inner walls of the flow tubes. As the reaction flow is heated in the thermal reactor and the reaction solution components begin to decompose, there is a propensity to develop deposits along the tube walls, which may lead to nanocrystal nucleation. Segmenting the flow provides a combination of flow, turbulence, and surface tension, which prevents deposits from forming and fouling the inner walls of the flow tubes.

Returning to FIG. 1, when a segmented reaction flow has been created, it may then be flowed along continuous flow path 110 to thermal reactor 140. In some examples, by rapidly increasing the energy level of the nanocrystal precursor using an energy source (e.g., microwave heating) before the segmented reaction flow is flowed to the thermal reactor, creation of nanocrystal nucleation can be started. However, for metal oxide nanoparticles, this process may be omitted.

To produce the nanocrystals from the nanocrystal precursors, heat must be introduced to the reaction. The thermal reactor may accomplish this in various ways, such as: thermal convection heating (forced air ovens, sand baths, oil baths, column heaters, and/or equivalent heating sources), near infrared heating (thereby stimulating the molecular vibrations of the reaction solution to induce heating), microwave heating (thereby selectively heating components within the reaction solution excepting for the non-polar solvent, which does not absorb microwave energy efficiently), and laser heating. The thermal reactor may utilize one or more of these methods to heat the reaction solution. The reaction solution may be brought to a temperature on the order of 300° C., although the temperature may be higher or lower depending on the components of the reaction solution and the properties of the desired nanocrystals.

The segmented reaction flow may be flowed through the thermal reactor for a duration based on the length of the flow path tubes extending through the thermal reactor, the internal diameter of the flow tubes, the temperature of the heat source, the uniformity of distribution of the heat within the tube, and the flow rate of the segmented reaction flow. Controllable parameters, such as flow rate and temperature, may be adjusted during the flow process based on metrology of flow exiting the thermal reactor, in order to maintain the consistency of the size and morphology of the resultant nanocrystals within desired ranges. For the synthesis of metal oxide nanocrystals, the duration the segmented reaction flow is flowed through the thermal reactor may be on the order of 200-300 seconds. However, this duration may be longer or shorter based on the application and the properties of the synthesized nanocrystal.

To provide an extended flow path through a thermal reactor with a minimal footprint, the flow path may be arranged in a serpentine arrangement within a rack that is receivable within the thermal reactor. A plurality of racks may be stacked on top of each other, thereby allowing effective heat distribution to the flow path while optimizing space within the thermal reactor. Alternatively, the flow path may be coiled to define a heat transfer coil, with a plurality of heat transfer coils received within the thermal reactor.

Upon exiting the thermal reactor, the product flow may be flowed along continuous flow path 110 to one or more quality meters 150. In-line metering may allow for real-time feedback regarding one or more of the optical and physical properties of the generated nanocrystals, which in turn may allow real time adjustments to one or more reaction parameters based on the monitored properties. For example, optical properties of the nanocrystals may be determined via spectroscopy (ultraviolet, visible, and/or near infrared), while dynamic light scattering and/or small angle X-ray scattering may be used to determine physical size properties of the nanocrystals. In some examples, the product flow may be subject to fluorometry, refractive index measurements, and/or other meters and devices for measuring one or more nanocrystal properties.

Nanocrystal size distribution may be include determining of the coefficient of variance (COV) through the use of small angle x-ray scattering (SAX), transmission electron microscopy (TEM), and/or x-ray diffraction (XRD) using standard techniques. The COV is then defined as being: COV=((standard deviation of particle size)/(average of particle size))*100%. The determined COV may then be compared to a threshold COV (e.g. <15%) to determine whether the nanocrystal size distribution is indicative of a product flow which should be collected or shunted to waste.

The degree of crystallinity or the purity of the crystalline phase can be determined by TEM using diffraction scattering patterns and performing a Fourier transform analysis to determine the crystalline structure of the material. Another technique that may be used to determine this is XRD, where the resultant diffraction pattern can be matched to a library of known crystal structures and verified as to being inhomogeneous (multiple contributions from different crystals) or homogeneous (one contributing pattern diffraction matching the desired crystal structure). Lack of a diffraction pattern in either XRD and/or TEM is indicative of an amorphous material, indicating little or no crystal structure.

The inventors of the present invention found out that, particularly, a distribution of sizes of nanocrystals having a certain size or less can be evaluated more appropriately not by merely comparing a standard deviation and/or coefficient of variance (COV) of particle diameters, but by comparing them together with an average of particle diameters. The description is made below with reference to FIG. 10.

Figure 10:
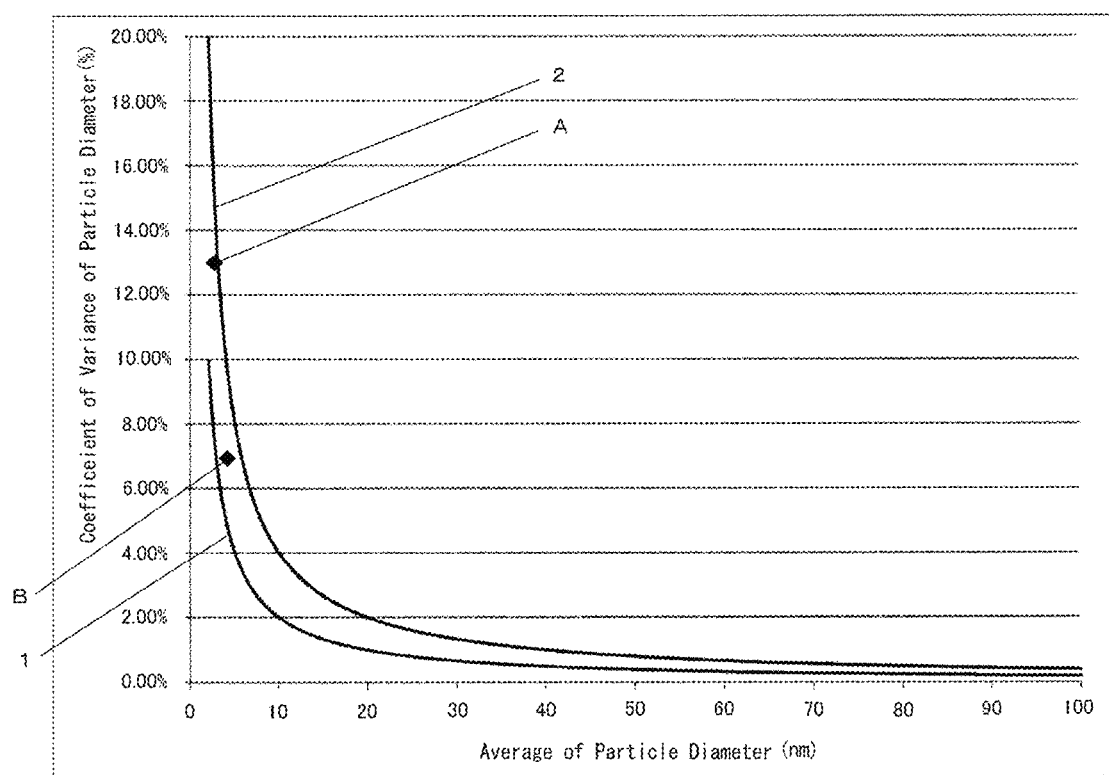
FIG. 10 is a graph showing a relationship between the average of particle diameter and the coefficient of variance of metal oxide nanocrystals.

FIG. 10 is a graph where the horizontal axis indicates the average of particle diameter, and the vertical axis indicates the coefficient of variance. Line 1 is obtained by connecting values of coefficients of variance calculated at the respective averages of particle diameter when a standard deviation of particle diameter is approximately 0.2 nm. About 0.2 nm is a value corresponding to one atom. Line 2 is obtained by connecting values of coefficients of variance calculated at the respective averages of particle diameter when a standard deviation of particle diameter is approximately 0.4 nm. About 0.4 nm is a value corresponding to one unit cell.

The following can be found from FIG. 10. In the case where the averages of particle diameters of nanocrystals are not less than a certain value (for example, 20 nm or more), a distribution of coefficients of variance caused by the averages of particle diameter is small even when the averages of particle diameter are different from each other. In contract, in the case where the averages of particle diameters of nanocrystals are smaller than a certain value (for example, less than 20 nm, particularly less than 10 nm), a large difference in coefficient of variance is generated even by a slight difference in average of particle diameter when the standard deviation is the same. As mentioned above, this is because the coefficient of variance is calculated by dividing the standard deviation of particle diameters by the averages of particle diameter. However, this shows that more appropriate evaluation can be performed compared with the comparison by size distribution by the comparison including averages of particle diameter, more appropriate evaluation can be performed compared with the comparison by size distribution according to the sizes of nanocrystals to be evaluated. In other words, when the averages of particle diameters of nanoparticles to be subjected to evaluation of size distribution are larger than a certain value (for example, 20 nm or more), the evaluation by mere comparison of standard deviation and/or coefficient of variance does not involve any major problem. However, when the averages of particle diameter of nanoparticles to be subjected to evaluation of size distribution include a value smaller than a certain value (for example, less than 20 nm, specifically less than 10 nm), even nanocrystals having a small standard deviation corresponding to one unit cell or one atom shows an extremely large coefficient of variance. Thus, an appropriate evaluation compared with conventional evaluations can be performed not by mere comparison of standard deviation and/or coefficient of variant, but by comparison of average of particle diameter together with the comparison of standard deviation and/or coefficient of variant at the same time.

Moreover, by the following management, nanocrystals having strictly managed and controlled size distribution compared with the conventional nanocrystals can be produced. For example, it is preferred that nanocrystals are produced by the production method comprising determining the size distribution of the nanocrystals based on the average of particle diameter in addition to a standard deviation and/or coefficient of variant of particle diameter in the method for producing nanocrystals where production conditions and/or the production flow are changed based on the size distribution of nanoparticles to be evaluated or measured.

For example, when nanocrystals are subjected to screening based on whether the coefficients of variance of particle diameters of the nanocrystals are larger than a predetermined value (threshold value), a plurality of threshold values may be set according to the averages of particle diameter. As an example, when the average of particle diameters of nanocrystals is the first value, the first threshold value is applied, and the nanocrystals are subjected to screening on the basis of the first threshold value. When the average of particle diameters of nanocrystals is the second value that is larger than the first value, the nanocrystals may be subjected to screening using the second threshold value that is different from the first threshold value. The screening of nanocrystals may be screening for quality grade or production classification or screening of whether the nanocrystals are wasted or not.

Metal oxide nanocrystals created by the method disclosed in the present invention have a really small size distribution. Rhombuses in FIG. 10 shows a size distribution of nanocrystals created by the method disclosed in the present invention based on the values obtained from the nanocrystals. Rhombus A represents metal oxide ($CeO_2$) nanocrystals having an average of particle diameter of 2.4 nm and a coefficient of variance of 13%, and rhombus B represents metal oxide (ITO) nanocrystals having an average of particle diameter of 4.4 nm and a coefficient of variance of 7%.

FIG. 10 shows that these nanocrystals each have a coefficient of variance smaller than line 1 (coefficient of variance calculated when a standard deviation of particle diameter is 0.4 nm). As can be also seen from the fact that approximately 0.4 nm is a value corresponding to one unit cell, it can be understood that these metal oxide nanocrystals each have a really small size distribution.

In the metal oxide nanocrystals, when averages of particle diameter and coefficients of variance of the metal oxide nanocrystals are plotted on an X-Y coordinate system with an X-axis representing the average of particle diameter (nm) and a Y-axis representing the coefficient of variance (%), the coefficients of variance at the respective plotted points are preferably smaller than coefficients of variance in a curve obtained by connecting values of coefficients of variance calculated at the respective averages of particle diameter when a standard deviation of particle diameter is 0.4 nm.

Further, in the metal oxide nanocrystals, when averages of particle diameter and coefficients of variance of the metal oxide nanocrystals are plotted on an X-Y coordinate system with an X-axis representing the average of particle diameter (nm) and a Y-axis representing the coefficient of variance (%), the coefficients of variance at the respective plotted points are preferably smaller than coefficients of variance in a straight line passing through a point 1 (10 nm, 4.0%) and a point 2 (2.7 nm, 15%).

The metal oxide nanocrystals preferably have an average of particle diameter of 20 nm or less, more preferably have an average of particle diameter of 10 nm or less.

The metal oxide nanocrystals according to the embodiments of the present invention each have a really small size distribution and thus have high reliability in various applications and consistency necessary for predictable use.

Particle size uniformity and particle stoichiometry homogeneity may be determined using absorbance spectrophotometry and/or photoluminescent emission. The absorbance and the photoluminescent properties of nanoparticles can be determined from FWHM (full width at half maximum, which is, at the height half of the maximum point of the absorbance or the photoluminescent peak, the width of the peak) obtained from a spectrum. An increase in the FWHM means that any of multiple effects could be taking place, such as: large particle size distribution (e.g., COV>15%), insufficient degree of crystallinity resulting in trap states that have different energies than a highly crystalline nanoparticle, and inhomogeneity of the material—giving rise to multiple excitations or emissions from the various regions within the nanoparticle or batch of nanoparticles. For doped metal oxides, such as ITO, the UV absorbance of the nanocrystals is dependent on the ratio of indium to tin in the nanocrystal. In some examples, a nanocrystal having a high degree of crystallinity, a homogeneous stoichiometry, and being monodisperse will give rise to absorption and/or photoluminescence peaks of: <50 nm FWHM from 400 nm-700 nm, <150 nm FWHM from 700 nm-2000 nm, <300 nm FWHM from 2000 nm-10000 nm.

Quality meters 150 may be in communication with a control system 115 that monitors the results from the quality meters and can reaction parameters as needed to optimize the quality of the nanocrystals in the product flow. For example, the flow rate of the segmented reaction flow through the thermal reactor may be increased or decreased. Also, the temperature within the thermal reactor may be increased or decreased. Further, for thermal reactors with more than one energy source, the relative distribution of the energy sources may be adjusted (e.g. more or less IR excitation). For multi-element nanocrystals, or other reactions that comprise 2 or more nanocrystal precursor solutions, the flow rates of the nanocrystal precursor solutions into the micromixer may be adjusted (flow rates relative to one another and/or absolute flow rates). In this way, a predetermined ratio of a first nanocrystal precursor solution to a second nanocrystal precursor solution may be adjusted. Absolute and/or relative concentrations may also be adjusted by increasing or decreasing a flow of solvent into the mixed reaction flow, as described with regard to FIG. 3. The flow rate of segmenting gas introduced into the mixed reaction flow may be increased or decreased, and/or may be adjusted to increase or decrease the size of the microreactions within the segmented reaction flow.

In some examples, the pressure within continuous flow path 110 may be increased or decreased. For example, increasing the pressure in the flow path may increase the boiling point of the reaction solvent, thereby allowing the system to operate at higher temperatures and energy levels. In one example, the flow path pressure may be increased by inserting a restrictive flow valve 180 into the flow path downstream of the thermal reactor. The restrictive flow valve 180 can be adjusted so as to increase the pressure in the flow path upstream of the valve, thereby increasing the pressure in the flow path through the thermal reactor.

If the monitored properties indicate a nanocrystal quality above a threshold, the product flow may be flowed to nanocrystal collecting device 155. If the monitored properties indicate nanocrystal quality below a threshold, the product flow may be shunted to waste device 160. The flow rates, thermal reactor temperature, and/or other parameters may then be adjusted accordingly, with the ensuing product flow then monitored for quality.

At nanocrystal collecting device 155, nanocrystal collection may removing the segmenting gas from the product flow, thereby creating an initial nanocrystal mixture. For example, flow path 110 may extend into a chamber where the solution drops downward and while the gas escapes and is collected from a vent above. Alternatively, the reactively inert gas can be separated at a future point downstream in the flow path as needed.

The continuous flow reactor 100 may further include a secondary reactor that is not shown, in addition to the thermal reactor. In some examples, such as for nanocrystals synthesized for inclusion in core-shell nanoparticles and/or quantum dots, the segmented reaction flow or the initial nanocrystal mixture may be flowed to a secondary reactor, where one or more additional reactants may be introduced to synthesize one or more shells over the initial nanocrystals. In some examples, the segmented reaction flow or the initial nanocrystal mixture may be flowed to a secondary reactor, where one or more additional reactants may be introduced to conjugate molecules to the nanocrystals and/or to the first coordinating ligands. Reactants in the segmented reaction flow or initial nanocrystal mixture that are unnecessary for downstream reactions, such as salt anions, un-coordinated ligands, etc. may be removed from solution (e.g., dialysis, incineration, etc.) prior to entering a secondary reactor. In some examples, the nanocrystals from the initial nanocrystal mixture may be precipitated, for example, with an organic solvent, washed, and/or re-dissolved in a solvent appropriate for downstream applications.

As shown in FIG. 1, the initial nanocrystal mixture may be flowed to ligand exchange reactor 170. In this way, a first coordinating ligand may be exchanged for a second coordinating ligand, thus conferring different properties on the nanocrystals. For example, metal-oxide nanocrystals synthesized in a non-polar solvent may be flowed to ligand exchange reactor 170 in order to exchange lipophilic first coordinating ligands for hydrophilic second coordinating ligands, thus rendering the nanocrystals soluble in aqueous solvents.

Figure 7:
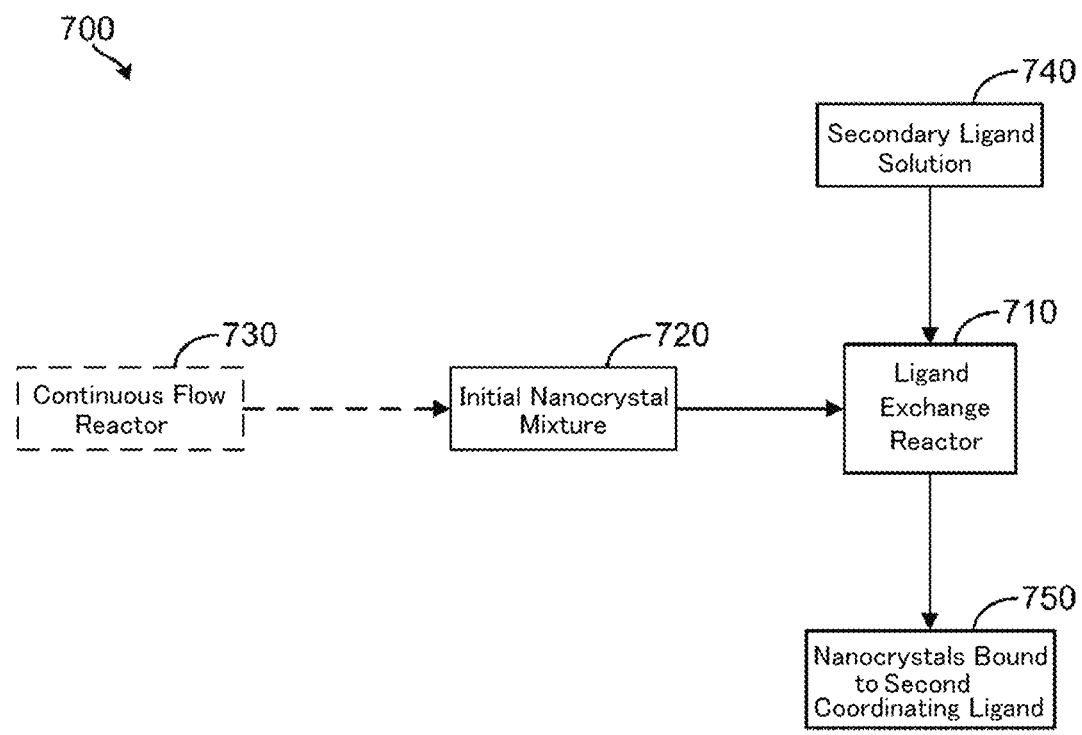
FIG. 7 schematically shows an example system for exchanging surface ligands bound to nanocrystals in solution.
Figure 8:
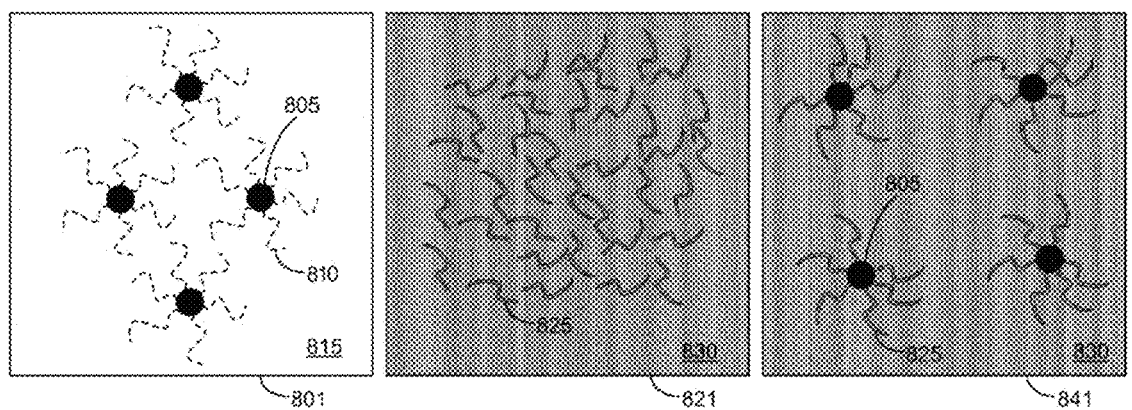
FIG. 8 schematically shows nanocrystals before and after exchanging surface ligands.
Figure 9:
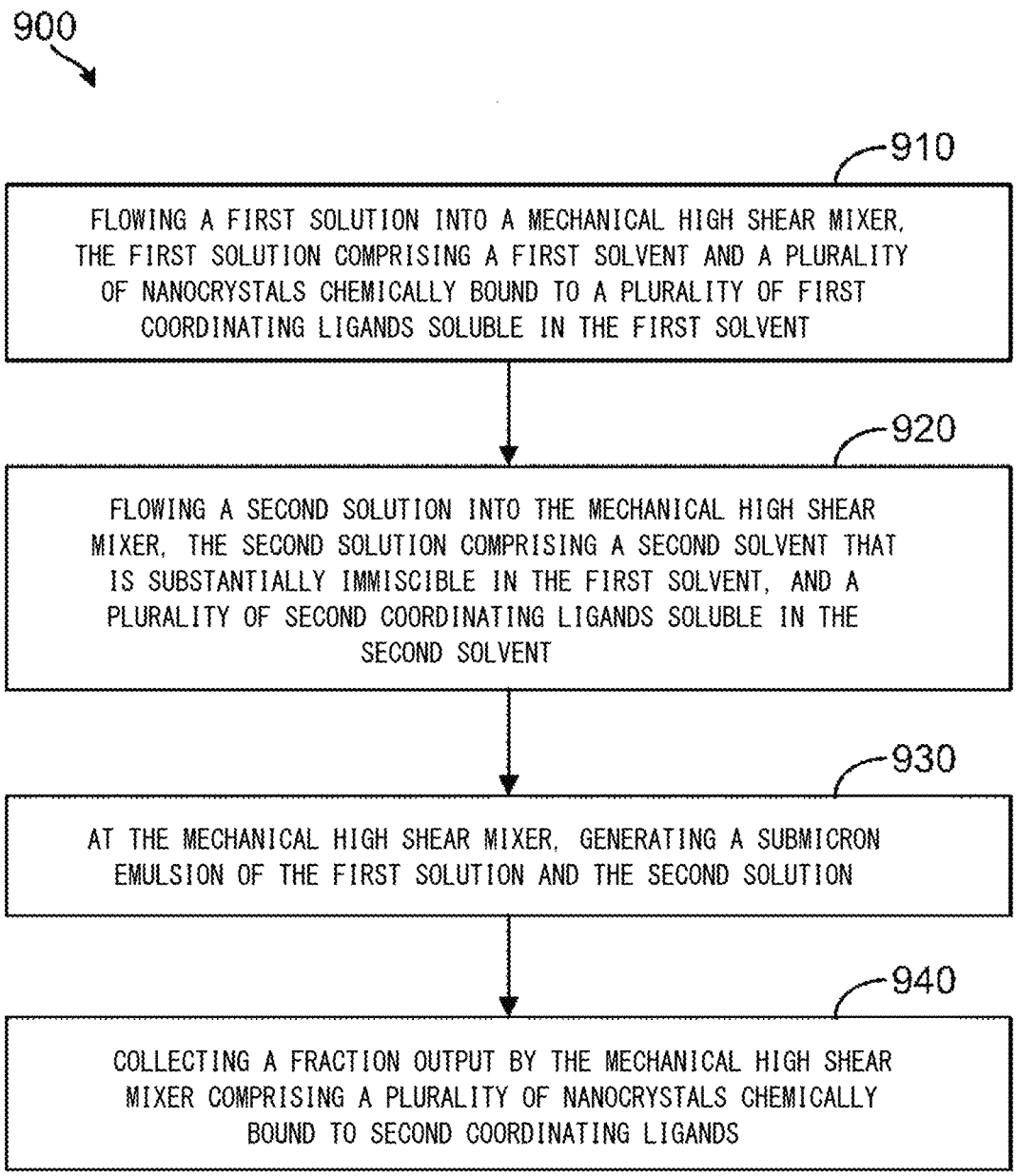
FIG. 9 depicts a flow chart for a high level method of exchanging surface bound to nanocrystals using a high shear mixer.

Systems and methods for ligand exchange are discussed further herein and with regard to FIGS. 7-9. Briefly, the initial nanocrystal mixture may be flowed to a ligand exchange reactor coupled within the continuous flow path. For example, the initial nanocrystal mixture may comprise metal-oxide nanocrystals, a non-polar solvent, and a first coordinating ligand soluble in the non-polar solvent. An aqueous ligand solution comprising a second, water-soluble coordinating ligand may concurrently be flowed to the ligand exchange reactor. The ligand exchange reactor may then promote the exchange of the first coordinating ligand for the second coordinating ligand by generating a submicron emulsion of the initial metal oxide nanocrystal mixture and the aqueous ligand solution. A water soluble fraction output by the ligand exchange reactor may then be collected, the water soluble fraction comprising metal oxide nanocrystals chemically bound to the second coordinating ligand. By introducing a flow of water-soluble ligand in one flow, a lipophilic nanomaterial in another flow, and flowing the two flows to a ligand exchange reactor, ligand exchange can proceed efficiently to allow for the production of water-soluble nanomaterials.

The creation of the submicron emulsion means almost uniform mixing state. For example, the mixing is performed preferably until an average diameter of droplets configuring the emulsion becomes 1 µm or less.

Figure 5:
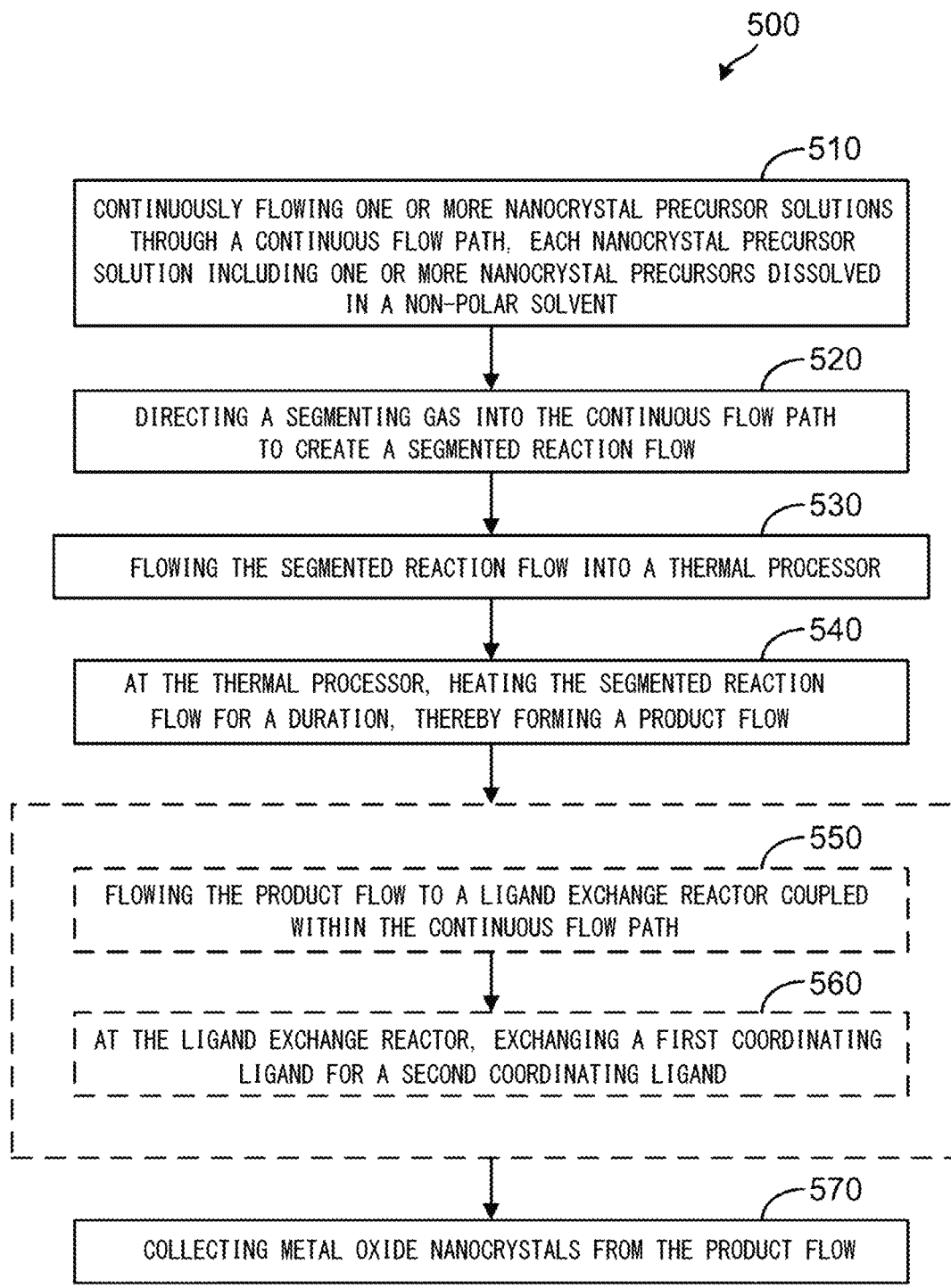
FIG. 5 depicts a flow chart for a method of synthesizing metal oxide nanocrystals in a continuous flow reactor.

The continuous flow reactor components depicted in FIGS. 1-4 may thus enable one or more methods for synthesizing nanocrystals in a continuous flow reactor. For example, FIG. 5 depicts a flow chart for a high level method 500 of synthesizing metal oxide nanocrystals in a continuous flow reactor. Method 500 begins at 510, where the method includes continuously flowing one or more nanocrystal precursor solutions through a continuous flow path, each nanocrystal precursor solution including one or more nanocrystal precursors dissolved in a non-polar solvent. The nanocrystal precursors may comprise one or more metal salts that are soluble in the non-polar solvent. The nanocrystal precursor solution may further comprise a first coordinating ligand, the first coordinating ligand soluble in the non-polar solvent. In some examples, one or more of the metal salts may comprise a polyatomic anion that includes one or more oxygen atoms, such as an acetate, nitrate, or sulfate. In some examples, salts may additionally or alternatively be a hydrated salt. In this way, the oxygen atoms from the polyatomic anion and/or the hydrating water molecules may be scavenged by the nanocrystal precursors to create the metal oxide nanocrystals.

Continuing at 520, method 500 includes directing a segmenting gas into the continuous flow path to create a segmented reaction flow. As described with regard to FIG. 4, an inert gas, such as nitrogen or argon, or another gas that is substantially immiscible in the non-polar solvent may be introduced into the continuous flow path to divide the nanocrystal precursor solution into micro-reactions. In some examples, the one or more nanocrystal precursor solutions may be flowed into a micromixer to create a mixed reaction solution prior to introducing the segmenting gas. Additionally or alternatively, the non-polar solvent may be flowed into the micromixer in addition to the one or more nanocrystal precursor solutions using a metering pump in order to adjust a concentration of the one or more nanocrystal precursors in the mixed reaction solution.

Continuing at 530, method 500 includes: flowing the segmented reaction flow into a thermal processor. The thermal processor may introduce heat to the micro-reactions, thus enabling the assembly of metal oxide nanocrystals. At 540, method 500 includes heating the segmented reaction flow for a duration at the thermal processor, thereby forming a product flow. The duration the segmented reaction flow spends in the thermal processor may be determined by the flow rate of the segmented reaction flow through the thermal processor.

Optionally, method 500 may then proceed to 550. At 550, method 500 may include flowing the product flow to a ligand exchange reactor coupled within the continuous flow path. As described with regard to FIG. 1, the segmenting gas may be removed prior to flowing the product flow to the ligand exchange reactor. Continuing at 560, method 500 may include: at the ligand exchange reactor, exchanging the first coordinating ligand for a second coordinating ligand. This process will be described in greater detail herein with regards to FIGS. 7-9. FIGS. 7-9 and the accompanying description focus on the use of an in-line, mechanical, ultra-high shear mixer, but other systems for creating an emulsion of two solutions, or otherwise promoting the energetically favorable transfer of the second coordinating ligand for the first coordinating ligand may be used, for example, a ligand exchange reactor may comprise one or more of a rotor-stator mixer, a vortex, a batch mixer, a grinding mill, a sonicator, and/or other appropriate device.

At 570, method 500 includes collecting metal oxide nanocrystals from the product flow. This may include removing the segmenting gas from the product flow (if still segmented), and precipitating the nanocrystals in an organic solvent. If the product flow was directed to the ligand exchange reactor, method 500 may thus include collecting metal oxide nanocrystals chemically bound to the second coordinating ligand. In some examples, prior to collecting metal oxide nanocrystals from the product flow, the product flow may be flowed to one or more quality meters, which may be utilized to monitor one or more properties of the product flow exiting the thermal processor.

Other metal oxides that may be synthesized using the above described systems and methods include, but are not limited to: tungstates (both cubic & hexagonal), samarium oxide, cerium oxide, tungsten oxide, tin oxide, nickel oxide, titanium oxide, niobium oxide, molybdenum oxide, tantalum oxide, iridium oxide, vanadium oxide, tin oxide, aluminum oxide, cesium tungstate, cerium orthovanadate, terbium orthovanadate, antimony-tin oxide, and aluminum-zinc oxide.

Figure 6:
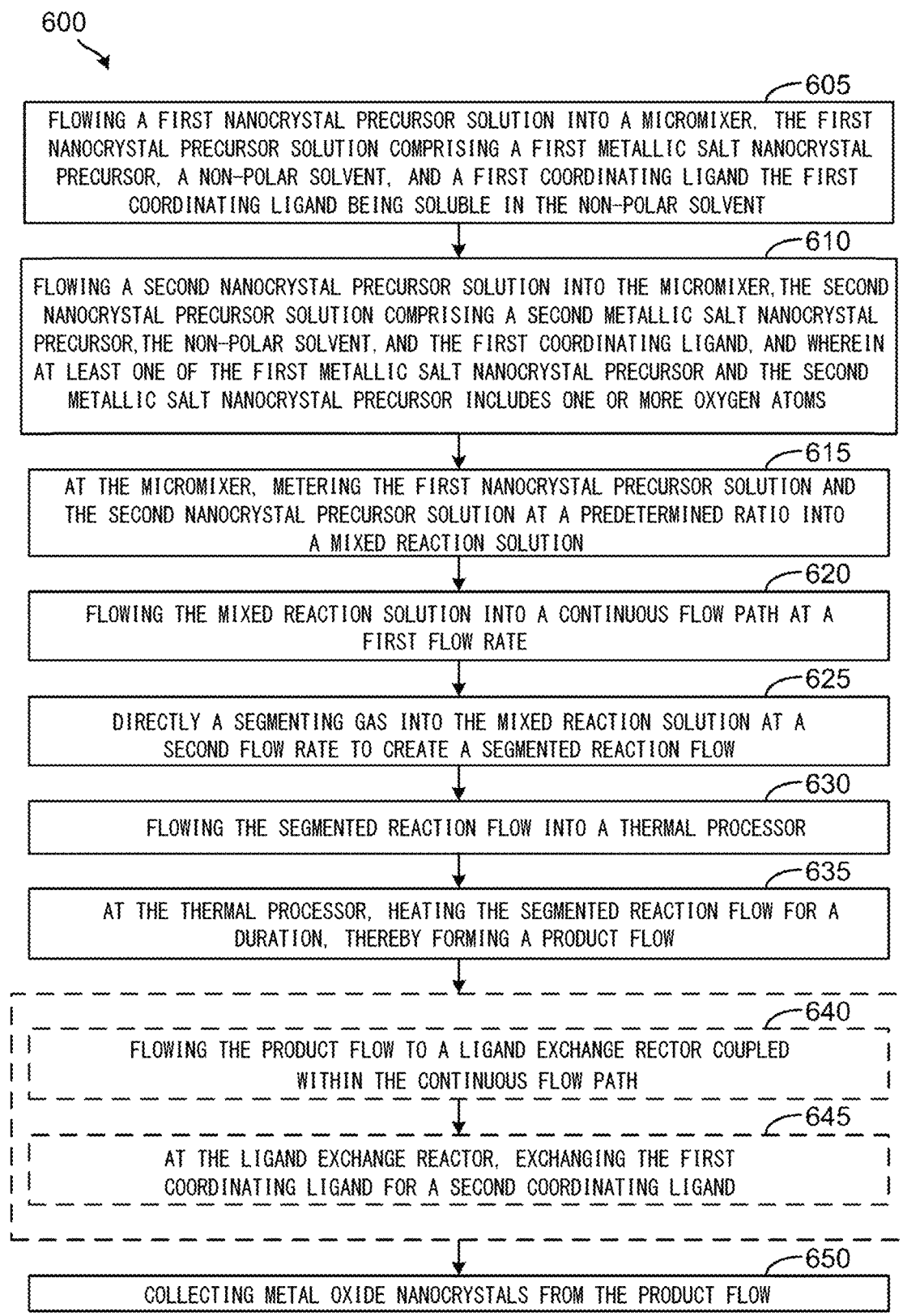
FIG. 6 depicts a flow chart for a method of synthesizing multi-element metal oxide nanocrystals in a continuous flow reactor.

The systems described herein and with regard to FIGS. 1-4, may further enable one or more methods for synthesizing multi-element metal oxide nanocrystals in a continuous flow reactor. A flow chart depicting an example high-level method 600 is shown in FIG. 6.

Method 600 includes, at 605, flowing a first nanocrystal precursor solution into a micromixer, the first nanocrystal precursor solution comprising a first metallic salt nanocrystal precursor, a non-polar solvent, and a first coordinating ligand, the first coordinating ligand being soluble in the non-polar solvent.

Continuing at 610, method 600 includes flowing a second nanocrystal precursor solution into the micromixer, the second nanocrystal precursor solution comprising a second metallic salt nanocrystal precursor, the non-polar solvent, and the first coordinating ligand, and wherein at least one of the first metallic salt nanocrystal precursor and the second metallic salt nanocrystal precursor includes one or more oxygen atoms. In some examples, different coordinating ligands may be included in the first and second nanocrystal precursor solutions, provided the coordinating ligands are soluble in the non-polar solvent.

At 615, method 600 includes, at the micromixer, metering the first nanocrystal precursor solution and the second nanocrystal precursor solution at a predetermined ratio into a mixed reaction solution. The predetermined ratio may be enabled by the flow rates of the first and second nanocrystal precursor solutions, which may be acted upon by one or more metering pumps. As described above and with regard to FIG. 3, the method may also include metering solvent into the mixed reaction solution in addition to the first and second nanocrystal precursor solutions. In some examples, the a solvent solution may be metered into the mixed reaction solution, the solvent solution comprising one or more coordinating ligands, one or more molecules including one or more oxygen atoms, one or more buffers, one or more surfactants, and/or additional reaction components and reactants aside from the nanocrystal precursors. Metering the solvent solution may adjust the overall concentration of nanocrystal precursors in the mixed reaction solution, or in some examples, solvent solution may be metered to adjust the concentration of one or more of the nanocrystal precursors prior to merging the first nanocrystal precursor solution and the second nanocrystal precursor solution into a mixed reaction solution.

Continuing at 620, method 600 includes flowing the mixed reaction solution into a continuous flow path at a first flow rate. At 625, method 600 includes delivering a segmenting gas into the mixed reaction solution at a second flow rate to create a segmented reaction flow. At 630, method 600 includes flowing the segmented reaction flow into a thermal processor.

At 635, method 600 includes, at the thermal processor, heating the segmented reaction flow for a duration, thereby forming a product flow. Optionally, at 640, method 600 may include flowing the product flow to a ligand exchange reactor coupled within the continuous flow path, and subsequently, at 645, method 600 may include, at the ligand exchange reactor, exchanging the first coordinating ligand for a second coordinating ligand.

At 650, method 600 includes collecting multi-element metal oxide nanocrystals from the product flow. In examples where the product flow is flowed to the ligand exchange reactor, this may include collecting multi-element metal oxide nanocrystals chemically bound to the second coordinating ligand.

Method 600 may be used in conjunction with the reaction flow systems of FIGS. 1-4 to synthesize multi-element metal oxide nanocrystals, for example, doped metal oxide nanocrystals. While the methods for synthesizing ITO described herein comprise generating a nanocrystal precursor solution that comprises both indium and tin, in other examples, an indium salt may be dissolved in a first nanocrystal precursor solution while a tin salt may be dissolved in a second nanocrystal precursor solution. Other multi-element metal oxide nanocrystals that may be synthesized in this way include, but are not limited to: cesium tungstate, cerium orthovanadate, terbium orthovanadate, antimony-tin oxide, and aluminum-zinc oxide.

As described herein, the function of nanoparticles may be broadened and/or enhanced by conjugating to functional surface ligands. However, the synthesis of the nanoparticles may result in an initial coordinating ligand bound to the nanoparticle, such as oleylamine or oleic acid in the above described nanocrystal synthesis reactions. Exchanging such ligands for a secondary ligand may be energetically unfavorable, for example, exchanging a lipophilic ligand for a hydrophilic ligand. Some nanomaterials, such as lead sulfide quantum dots, bind their ligands tightly, making ligand exchange unfavorable. Methods for ligand exchange are thus often lengthy procedures which have low yields.

FIG. 7 schematically shows an example system 700 for exchanging surface ligands bound to nanocrystals in solution. System 700 includes ligand exchange reactor 710. Ligand exchange reactor 710 may be configured to receive a flow of a first solution, such as initial nanoparticle mixture 720, and further configured to receive a flow of a second solution, such as secondary ligand solution 740, where the second solution is substantially immiscible in the first solution. Ligand exchange reactor 710 may be a mechanical high shear mixer, such as an inline ultra-high shear mixer, but other types of mixer may be used.

The mechanical high-shear mixer is of, for example, a flow-through system where two liquids are injected between two plates each rotating in a direction opposite to each other in the mechanical high-shear mixer. The two liquids are injected from different directions, preferably from directions opposite to each other. Particularly preferably, one of the two liquids is injected from the upper side, and the other liquid is injected from the lower side. The flows of the liquids passing through the space between the two plates are sheared to highly mix the two solvents that are generally immiscible to each other.

In some examples, initial nanocrystal mixture 720 may be provided in a continuous flow path from a continuous flow reactor 730. For example, as shown in FIG. 1, a continuous flow reactor may output collected nanocrystals to a ligand exchange reactor. In some examples, additional methods or processes may be coupled in a continuous flow path between the continuous flow reactor and the ligand exchange reactor that are not depicted in FIG. 1 or FIG. 7. For example, the nanocrystals may be washed, precipitated, re-dissolved, diluted, etc. prior to being flowed to the ligand exchange reactor.

Initial nanocrystal mixture 720 may comprise a plurality of nanocrystals chemically bound to a plurality of first coordinating ligands soluble in the first solvent, while secondary ligand solution may comprise a plurality of second coordinating ligands soluble in the second solvent. The ligand exchange reactor may generate a sub-micron emulsion from the initial nanocrystal mixture and the secondary ligand solution. In this way, the second coordinating ligand is exposed to the surface of the nanocrystals, thus rendering exchange of the second coordinating ligand for the first coordinating ligand energetically favorable. A fraction output by the ligand exchange reactor comprising the second solvent may then comprise nanocrystals bound to the second coordinating ligand (750). This allows ligand exchange to be performed with types of second coordinating ligands that would otherwise be difficult to bind to nanocrystals due to the energetically unfavorable nature of the exchange. For example, many batch methods of ligand exchange are restricted to amphiphilic ligands, and/or require a surfactant to generate an emulsion.

Further, the collection of a phase separated fraction from the ligand exchange reactor allows for collection of nanocrystals bound to the second coordinating ligand without the ligand exchange reaction proceeding to completion. This allows for particularly unfavorable exchanges to yield the product of interest, even if not all nanocrystals undergo ligand exchange. The output of the ligand exchange reactor may be analyzed by one or more quality meters. For example, the secondary ligand may confer unique optical properties on the nanocrystals, and thus the output may be flowed through one or more spectrometers. Based on the results of the metrology, one or more parameters for the ligand exchange reaction may be adjusted. For example, the ratio of the initial nanocrystal mixture to the secondary ligand solution may be adjusted by altering the flow rates of the first and/or second solutions into the ligand exchange reactor. Mixing parameters, such as a speed of a rotor in a rotor-stator shear mixer, may also be adjusted base on the results of the metrology. The collected nanocrystals bound to the second coordinating ligand may be purified by precipitation in an organic solvent, such as acetone, and then may be re-dissolved in an appropriate buffer for downstream applications comprising the second solvent.

FIG. 8 schematically shows nanocrystals before and after exchanging surface ligands. An example initial nanocrystal mixture is depicted at 801, comprising nanocrystals 805 bound to first coordinating ligands 810. First coordinating ligands 810 are soluble in first solvent 815. An example secondary ligand solution is depicted at 821, comprising second coordinating ligands 825 in solution in second solvent 830. First solvent 815 and second solvent 830 may be considered substantially immiscible, while first coordinating ligand 810 may be considered relatively insoluble in second solvent 830, and second coordinating ligand 825 may be considered relatively insoluble in first solvent 815. Following the generation of a sub-micron emulsion of the initial nanocrystal mixture and the secondary ligand solution, nanocrystals 805 bound to second coordinating ligands 825 may be collected in second solvent 830, as shown at 841.

For example, as described herein, metal oxide nanocrystals, such as ITO may be synthesized in a continuous flow reactor in a 1-octadecene solvent utilizing oleylamine and/or oleic acid as a first coordinating ligand. In order to produce water-soluble ITO nanocrystals, the first coordinating ligand may be exchanged for a water soluble ligand. For example, the secondary ligand solution may comprise polyacrylic acid (PA) in an aqueous solution. The aqueous solution may include buffers, salts, and/or other materials that may render the exchange of PA for oleylamine/oleic acid favorable in a submicron emulsion. PA binds strongly to metal oxides, and thus by creating an emulsion of water-soluble ligand and lipophilic nanomaterial with a mechanical high-shear mixer, ligand exchange can proceed efficiently to allow for the production of water-soluble ITO nanocrystals. The exchange of PA for oleylamine/oleic acid may be performed for other metal oxide nanoparticles, such as tungstates, cesium tungstate, samarium oxide, etc.

In another example, semiconductor nanoparticles such as lead sulfide may also be synthesized in a continuous flow reactor in a 1-octadecene solvent utilizing oleylamine and/or oleic acid as a first coordinating ligand. Energy transfer for a lead sulfide quantum dot may enhanced by conjugating an amine-terminated hydrocarbon such as octylamine to the nanocrystals. However, as lead sulfide tightly binds ligands, batch methods for ligand exchange may take days or longer to reach even a 10% yield. By flowing the 1-octadecene soluble nanocrystals into the ligand exchange reactor along with a solution of octylamine in an organic solvent (such as ethanol, benzene, or ethyl acetate), a submicron emulsion can be generated so that lead sulfide nanocrystals chemically coupled to octylamine may be retrieved. By using a mechanical high-shear mixer to create the submicron emulsion, the reaction may proceed to a 70% yield in a duration on the order of 3-5 seconds.

Other nanocrystals may be subject to ligand exchange in this fashion as well, including but not limited to: indium phosphide, cadmium selenide, cadmium halides, lead halides, lead chalcogenides, mercury halides, aluminum oxides, and titanium oxides. Nanocrystals may undergo ligand exchange to alter solubility from a non-polar solvent to a polar solvent, from an organic solvent to an aqueous solvent, from a hydrocarbon solvent to an organic solvent, or for other phase solubility exchanges. Ligand exchange may also proceed in the reverse direction for any of the described examples (e.g. from an aqueous solution to an organic solvent) provided the exchange can be made energetically favorable with a mechanical high shear mixer. In this way, nanocrystals may be conjugated to ligands for a broad range of applications, including biological and therapeutic functions. For example, peptide and/or nucleotide polymers may be conjugated to nanocrystals via ligand exchange. Biologically active small molecules, targeting molecules, antibodies, radioactive isotopes, and other functional groups may be conjugated to nanocrystals via ligand exchange to provide additional functionality. In other examples, polymers, chemical fluorophores, and other functional groups may be conjugated to nanocrystals via ligand exchange.

The ligand exchange systems of FIGS. 1 and 7 may thus enable one or more methods for exchanging surface ligands on nanocrystals. As an example, FIG. 9 depicts a flow chart for a high-level method 900 for ligand exchange using a mechanical high shear mixer.

Method 900 begins at 910. At 910, method 900 includes flowing a first solution into a mechanical high shear mixer, the first solution comprising a first solvent and a plurality of nanocrystals chemically bound to a plurality of first coordinating ligands soluble in the first solvent. The first solution may be received as part of a continuous flow process, such as a continuous flow nanocrystal synthesis reaction.

Continuing at 920, method 900 includes flowing a second solution into the mechanical high shear mixer, the second solution comprising a second solvent that is substantially immiscible in the first solvent, and a plurality of second coordinating ligands soluble in the second solvent. In some examples, the second solvent may comprise a surfactant.

In some examples, the first solvent may be a non-polar solvent, while the second solvent is a polar solvent. For example, for the metal oxide nanocrystal examples described herein, the first solvent may be 1-octadecene, while the second solvent may be water. In such an example, the first coordinating ligand may be oleylamine and/or oleic acid, while the second coordinating ligand may be polyacrylic acid. In other examples, such as the semiconductor nanocrystal examples described herein, the first solution may comprise lead chalcogenide nanocrystals, such as lead sulfide nanocrystals, coupled to oleylamine and/or oleic acid in a 1-octadecene solvent. The second solution may comprise an amine terminated hydrocarbon in an organic solvent such as ethanol, benzene, or ethyl acetate.

In other examples, the first solvent may be a polar solvent, and the second solvent may be a non-polar solvent. In such an example, the first solvent may be water and the second solvent may be a hydrocarbon solvent.

Continuing at 930, method 900 includes: at the mechanical high shear mixer, generating a submicron emulsion of the first solution and the second solution. This may render the exchange of the second coordinating ligands for the first coordinating ligands energetically favorable, by allowing the second coordinating ligands to come into close contact with the nanocrystals.

Continuing at 940, method 900 includes collecting a fraction output by the mechanical high shear mixer comprising a plurality of nanocrystals chemically bound to the second coordinating ligands. The nanocrystals chemically bound to the second coordinating ligands may be identified based on their solubility in the second solvent. For example, in the scenario where the first solvent is 1-octadecene and the second solvent is water, an aqueous fraction may be collected from the mechanical high shear mixer containing nanocrystals that have been rendered water-soluble through ligand exchange.

It will be understood that the configurations and/or approaches described herein are presented for example, and that these specific examples or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and subcombinations of the various processes, systems and configurations, and other features, functions, acts, and/or properties disclosed herein, as well as any and all equivalents thereof.

The present invention comprises the following embodiments.

<1> A method for producing nanocrystals by continuously flowing a nanocrystal precursor solution comprising a nanocrystal precursor into a continuous flow path and heating the nanocrystal precursor solution in the continuous flow path to create nanocrystals, comprising:

providing a nanocrystal precursor solution supply unit that is connected to the continuous flow path and comprises a first vessel and a second vessel;

delivering a nanocrystal precursor solution in the second vessel to the continuous flow path; and creating a nanocrystal precursor solution in the first vessel as a different batch from the nanocrystal precursor solution in the second vessel.

<2> The method according to the item <1> above, wherein time of the delivering of a nanocrystal precursor solution in the second vessel comprises time of the delivering performed in parallel with creation of the nanocrystal precursor solution in the first vessel.

<3> The method according to the item <1> or <2> above, further comprising:

monitoring the amount of the nanocrystal precursor solution in the second vessel.

<4> The method according to the item <3> above, wherein the creating a nanocrystal precursor solution in the first vessel begins when the amount of the nanocrystal precursor solution in the second vessel falls below a predetermined value.

<5> The method according to any one of the items <1> to <4> above, wherein the continuous flow path comprises a mixer, and the nanocrystal precursor solution introduced from the nanocrystal precursor solution supply unit into the continuous flow path is mixed with the mixer.

<6> The method according to the item <5> above, wherein the nanocrystal precursor solution introduced from the nanocrystal precursor solution supply unit into the continuous flow path and a second nanocrystal precursor solution with composition different from the nanocrystal precursor solution introduced from the nanocrystal precursor solution supply unit into the continuous flow path are mixed with the mixer.

<7> The method according to any one of the items <1> to <6> above, further comprising:

delivering the nanocrystal precursor solution created in the first vessel into the second vessel; and mixing the nanocrystal precursor solution delivered from the first vessel into the second vessel and the nanocrystal precursor solution in the second vessel.

<8> The method according to any one of the items <1> to <6> above, further comprising:

delivering the nanocrystal precursor solution created in the first vessel toward the continuous flow path; and creating a new nanocrystal precursor solution in the second vessel as a different batch.

<9> A nanocrystal production device comprising:

a continuous flow reactor comprising: a continuous flow path into which a nanocrystal precursor solution flows; and a thermal processor provided on the continuous flow path and configured to heat the nanocrystal precursor solution flowing in the continuous flow path to create nanocrystals; and a nanocrystal precursor solution supply unit connected to the continuous flow path in the continuous flow reactor, wherein the nanocrystal precursor solution supply unit comprises:

a second vessel configured to deliver a nanocrystal precursor solution in the nanocrystal precursor solution supply unit toward the continuous flow path; and a first vessel configured to create a nanocrystal precursor solution as a different batch from the nanocrystal precursor solution in the second vessel.

<10> The nanocrystal production device according to the item <9> above, further comprising:

a segmenting gas introduction section configured to introduce a segmenting gas at a point in the continuous flow path in the continuous flow reactor, upstream of the thermal processor to segment a flow of the nanocrystal precursor.

<11> The nanocrystal production device according to the item <9> or <10> above, further comprising second nanocrystal precursor solution supply unit configured to supply a second nanocrystal precursor solution with different composition from the nanocrystal precursor solution.

<12> The nanocrystal production device according to any one of the item <9> to <11> above, wherein the second vessel receives the nanocrystal precursor solution created in the first vessel and supplies the receives nanocrystal precursor solution to the continuous flow path.

<13> The nanocrystal production device according to the item <12> above, wherein the second vessel of the nanocrystal precursor solution supply unit is configured to be capable of independently controlling an inflow amount per unit time from the first vessel and a delivery amount per unit time to outside of the second vessel.

<14> The nanocrystal production device according to the item <12> or <13> above, wherein the second vessel comprises a liquid amount detector configured to be capable of detecting the amount of the nanocrystal precursor solution in the second vessel.

<15> The nanocrystal production device according to any one of the item <9> to <14> above, wherein the second vessel is configured to be capable of blocking inside air from outside air.

<16> The nanocrystal production device according to any one of the items <9> to <11> above, wherein supplying the nanocrystal precursor solution from the second vessel to the continuous flow path is switchable to supplying the nanocrystal precursor solution from the first vessel to the continuous flow path.

<17> The nanocrystal production device according to any one of the items <9> to <16> above, wherein the continuous flow path comprises:

a mixer configured to uniformly mixing the nanocrystal precursor solution;

a distributor configured to distribute the mixed nanocrystal precursor solution; and a plurality of parallel flow paths into which the respective distributed nanocrystal precursor solutions are flowed in the thermal processor.

<18> The nanocrystal production device according to the item <17> above, wherein the parallel flow paths comprise a first section between the distributor and the thermal processor, and the first section in the parallel flow paths further comprises a segmenting gas introduction section configured to introduce a segmenting gas to segment a flow of the nanocrystal precursor.

<19> The nanocrystal production device according to the item <18> above, wherein when an average of cross-sectional areas of the parallel flow paths in the first section is represented by Sa, the cross-sectional areas of the parallel flow paths are in the range of 0.9 to 1.1 times the Sa.

<20> A nanocrystal production device comprising:

a continuous flow reactor comprising: a continuous flow path into which a nanocrystal precursor solution flows; and a thermal processor provided on the continuous flow path and configured to heat the nanocrystal precursor solution flowing in the continuous flow path to create nanocrystals wherein the continuous flow path comprises:

a mixer configured to uniformly mixing the nanocrystal precursor solution;

a distributor configured to distribute the mixed nanocrystal precursor solution; and a plurality of parallel flow paths into which the respective distributed nanocrystal precursor solutions are flowed in the thermal processor.

<21> The nanocrystal production device according to the item <20> above, wherein the parallel flow paths comprise a first section between the distributor and the thermal processor, and the first section in the parallel flow paths further comprises a segmenting gas introduction section configured to introduce a segmenting gas to segment a flow of the nanocrystal precursor.

<22> The nanocrystal production device according to the item <20> or <21> above, wherein when an average of cross-sectional areas of the parallel flow paths in the first section is represented by Sa, the cross-sectional areas of the parallel flow paths are in the range of 0.9 to 1.1 times the Sa.

<23> The nanocrystal production device according to the item <22> above, wherein when the cross-sectional area of a section between the mixer and the distributor in the continuous flow path is represented by Sb, the Sb is 0.9 times or more the Sa.

[1] A method for exchanging surface ligands of nanocrystals, comprising:

flowing a first solution comprising: a first solvent; and a first solution comprising a plurality of nanocrystals chemically bound to a plurality of first coordinating ligands soluble in the first solvent and a second solution comprising: a second solvent substantially immiscible in the first solvent; and a plurality of second coordinating ligands soluble in the second solvent in a mechanical high-shear mixer;

creating a submicron emulsion in the first solution and the second solution in the mechanical high-shear mixer;

collecting a fraction comprising a plurality of nanocrystals chemically bound to the second coordinating ligand, created in the mechanical high-shear mixer.

[2] The method according to the item [1] above, wherein the first solvent is a non-polar solvent, and the second solvent is a polar solvent.

[3] The method according to the item [1] or [2] above, wherein the first solvent is 1-octadecene, and the second solvent is water.

[4] The method according to any one of the items [1] to [3] above, wherein the first coordinating ligand is oleylamine.

[5] The method according to any one of the items [1] to [4] above, wherein the second coordinating ligand is polyacrylic acid.

[6] The method according to any one of the items [1] to [5] above, wherein

The plurality of nanocrystals are electrochromic metal oxide nanocrystals.

[7] A method for producing hydrophilic nanocrystals, comprising exchanging surface ligands of nanocrystals according to any one of the items [1] to [6] above.

[8] The method according to the item [1] above, wherein the first solvent is a polar solvent, and the second solvent is a non-polar solvent.

[9] The method according to the item [7] above, wherein the first solvent is water, and the second solvent is a hydrocarbon solvent.

[10] The method according to the items [1] to [6], [8], and [9] above, wherein the second solution further comprises one or more surfactants.

[11] A method for exchanging surface ligands on nanocrystals, comprising, in a flow process;

merging a first solution comprising: a first solvent; and a first solution comprising a plurality of nanocrystals chemically bound to a plurality of first coordinating ligands soluble in the first solvent and a second solution comprising: a second solvent substantially immiscible in the first solvent; and a plurality of second coordinating ligands which are soluble in the second solvent but are insoluble in the first solvent;

mechanically creating a submicron emulsion of the first solution and the second solution to render the exchange of the plurality of second coordinating ligands for the plurality of first coordinating ligands energetically favorable; and collecting nanocrystals soluble in the second solvent.

[12] The method according to the item [11] above, wherein the first solvent is a non-polar solvent, and the second solvent is a polar solvent.

[13] The method according to the item [11] or [12] above, wherein the first solvent is a hydrocarbon solvent, and the second solvent is an organic solvent.

[14] The method according to any one of the items [11] to [13] above, wherein the plurality of first coordinating ligands comprises one or more of oleylamine and oleic acid, and the plurality of second coordinating ligands comprise amine-terminated hydrocarbon.

[15] The method according to any one of the items [11] to [14] above, wherein the plurality of nanocrystals comprises semiconductor nanocrystals.

[16] The method according to the item [15] above, wherein the semiconductor nanocrystals comprise lead chalcogenide.

[17] A method for exchanging surface ligands on nanocrystals, comprising:

the step of, in a continuous flow process, receiving a first solution comprising a mixture of metal oxide nanocrystals in 1-octadecen, the metal oxide nanocrystals chemically binding to oleylamine;

the step of receiving a second solution comprising an aqueous polyacrylic acid solution;

the step of flowing the first solution and the second solution in a mechanical high-shear mixer;

the step of creating a submicron emulsion of the first solution and the second solution in the mechanical high-shear mixer; and the step of collecting an aqueous fraction of an output of the mechanical high-shear mixer, the aqueous fraction comprising a plurality of metal oxide nanocrystals chemically binding to polyacrylic acid.

[18] The method according to the item [17] above, wherein the first solution is caused to path through one or more in-line monitors to measure one or more properties of the metal oxide nanocrystals, and the step of flowing the first solution in the mechanical high-shear mixer is based on the one or more measured properties.

[19] The method according to the item [17] or [18] above, further comprising:

the step of monitoring one or more properties of the collected aqueous fraction; and the step of adjusting the flow rate of one or more of the first solution and the second solution into the mechanical high-shear mixer based on the one or more monitored properties.

[20] The method according to any one of the items [17] to [19] above, further comprising:

the step of precipitating, in acetone, the metal oxide nanocrystals chemically bound to polyacrylic acid; and the step of re-solving the metal oxide nanocrystals chemically bound to polyacrylic acid.

[21] The method according to any one of the items [17] to [20] above, wherein the metal oxide nanocrystals comprise one or more of indium-tin oxide, samarium oxide, cerium oxide, tungsten oxide, and cesium tungstate.

EXAMPLE

The following describes the present invention in further detail using examples. The present invention, however, is by no means limited thereto.

Example 1

Method 500 was used with the systems described herein and depicted in FIGS. 1-4 to synthesize cerium (IV) oxide nanocrystals. A nanocrystal precursor solution was prepared comprising 7.2 g of cerium ammonium nitrate $(Ce(NH_4)_2(NO_3)_6$; 66.5 g of oleylamine (or 70.2 g oleic acid); and 40 ml of 1-octadecene. The precursor solution components were mixed for 1 hour at room temperature in a 500 ml three-neck flask subject to a vacuum. The resulting nanocrystal precursor solution was then pumped into a flow path comprising one a 1/16" inner-diameter tube at a flow rate of 0.3 ml/min. Nitrogen (room temperature, 1 atm) was introduced as a segmenting gas at a flow rate of 0.12 ml/min. The segmented reaction flow was then flowed to a thermal reactor, where it was heated to 180° C. over a 40-foot flow path length. The cerium oxide nanocrystals included in the resulting product flow were then either purified by precipitating with acetone and then re-dissolved in hexane, or flowed to a high-shear mixer, where an emulsion was made of the product flow and an aqueous solution comprising polyacrylic acid. An aqueous fraction of the output of the high shear mixer was then collected comprising cerium oxide nanocrystals chemically bound to polyacrylic acid. The collected cerium nanocrystals had an average of particle diameter of 2.94 nm.

Example 2

Method 500 was used with the systems described herein and depicted in FIGS. 1-4 to synthesize indium-tin oxide (ITO) nanocrystals. A nanocrystal precursor solution was prepared comprising 10 g of indium acetate dehydrate; 0.9 g of tin acetate; 66.7 g of oleylamine (or 70.4 g oleic acid); and 40 ml of 1-octadecene. The precursor solution components were mixed for 1 hour at 110° C. in a 500 ml three-neck flask subject to a vacuum. The solution was then cooled to room temperature and backfilled with nitrogen. The resulting nanocrystal precursor solution was then pumped into a flow path comprising one a 1/16" inner-diameter tube at a flow rate of 0.3 ml/min. Nitrogen (room temperature, 1 atm) was introduced as a segmenting gas at a flow rate of 0.12 ml/min. The segmented reaction flow was then flowed to a thermal reactor, where it was heated to 190° C. over a 40-foot flow path length. The ITO nanocrystals included in the resulting product flow were then either purified by precipitating with acetone and then re-dissolved in hexane, or flowed to a high-shear mixer, where an emulsion was made of the product flow and an aqueous solution comprising polyacrylic acid. An aqueous fraction of the output of the high shear mixer was then collected comprising ITO nanocrystals chemically bound to polyacrylic acid. The collected ITO nanocrystals were on the order of 5 nm in diameter, with a dispersion of less than 10%, and a COV of approximately 7%.

Comparative Example 1

For comparison, nanocrystals were prepared by batch methods using the same reactants as in example 2. ITO nanocrystals with the average of particle diameter of 4.43 nm, a dispersion of approximately 20%, and a COV of approximately 15% were obtained.

Comparative Example 2

By a flow method that is insufficient in mixing in a microreactions, ITO nanocrystals with a COV of approximately 11% were obtained, but dispersion of their particle diameters was large.

The invention claimed is:

1. A method for producing metal oxide nanocrystals, comprising:

continuously flowing, into a continuous flow path, one or a plurality of nanocrystal precursor solutions each comprising one or more nanocrystal precursors dissolved in a non-polar solvent;

directing a segmenting gas into the continuous flow path to create a segmented reaction flow;

flowing the segmented reaction flow into a thermal processor;

heating the segmented reaction flow in the thermal processor to create a product flow; and collecting metal oxide nanocrystals from the product flow, wherein the collecting of the metal oxide nanocrystals comprises:

flowing the product flow to a ligand exchange reactor coupled within the continuous flow path;

exchanging a first coordinating ligand for a second coordinating ligand in the ligand exchange reactor; and collecting metal oxide nanocrystals chemically bound to the second coordinating ligand.

2. A method for producing metal oxide nanocrystals, comprising:

continuously flowing, into a continuous flow path, one or a plurality of nanocrystal precursor solutions each comprising one or more nanocrystal precursors dissolved in a non-polar solvent; wherein the nanocrystal precursor solutions are prepared by mixing one or more metal salts comprising a polyatomic anion that includes one or more oxygen atoms with the non-polar solvent and a first coordinating ligand that is soluble in the non-polar solvent;

directing a segmenting gas into the continuous flow path to create a segmented reaction flow;

flowing the segmented reaction flow into a thermal processor;

heating the segmented reaction flow in the thermal processor to create a product flow; and collecting metal oxide nanocrystals from the product flow, wherein the collecting of the metal oxide nanocrystals comprises:

flowing the product flow to a ligand exchange reactor coupled within the continuous flow path;

exchanging the first coordinating ligand for a second coordinating ligand in the ligand exchange reactor; and collecting metal oxide nanocrystals chemically bound to the second coordinating ligand.

* * * * *